US007786968B2

(12) United States Patent
Yokoyama et al.

(10) Patent No.: US 7,786,968 B2
(45) Date of Patent: Aug. 31, 2010

(54) PULSE OUTPUT CIRCUIT, DRIVING CIRCUIT FOR DISPLAY DEVICE AND DISPLAY DEVICE USING THE PULSE OUTPUT CIRCUIT, AND PULSE OUTPUT METHOD

(75) Inventors: Makoto Yokoyama, Matsusaka (JP); Hajime Washio, Sakurai (JP); Yuhichiroh Murakami, Matsusaka (JP); Kenji Hyoudou, Osaka (JP); Hiroshi Murofushi, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 1153 days.

(21) Appl. No.: 11/002,684

(22) Filed: Dec. 3, 2004

(65) Prior Publication Data

US 2005/0134352 A1 Jun. 23, 2005

(30) Foreign Application Priority Data

Dec. 4, 2003 (JP) ............................ 2003-406293
Nov. 18, 2004 (JP) ............................ 2004-334768

(51) Int. Cl.
*H03M 1/50* (2006.01)

(52) U.S. Cl. ........................................ 345/94; 345/100

(58) Field of Classification Search .................. 345/94, 345/100

See application file for complete search history.

(56) References Cited

U.S. PATENT DOCUMENTS 3,997,269 A * 12/1976 Moulton ..................... 356/639
4,626,841 A * 12/1986 Togashi ...................... 345/210
4,933,774 A * 6/1990 Ishimaru ...................... 386/84
5,245,431 A * 9/1993 Okada et al. ................ 348/531
5,818,412 A * 10/1998 Maekawa .................. 345/100
6,157,361 A 12/2000 Kubota
6,373,460 B1 4/2002 Kubota
6,392,628 B1 * 5/2002 Yamazaki et al. ............. 345/98
6,492,972 B1 * 12/2002 Kubota et al. ............... 345/100
6,496,169 B1 * 12/2002 Mametsuka .................. 345/87
6,670,944 B1 * 12/2003 Ishii .......................... 345/100
6,724,361 B1 4/2004 Washio et al.
6,734,705 B2 * 5/2004 Pulkin et al. .................. 326/68
6,909,417 B2 * 6/2005 Washio et al. ................. 345/98

(Continued)

FOREIGN PATENT DOCUMENTS

JP 5-216441 A 8/1993
JP 5-241536 A 9/1993
JP 07-013527 1/1995
JP 9-212133 A 8/1997
JP 2000-259111 9/2000
JP 2001-307495 11/2001
JP 2002-202747 7/2002

*Primary Examiner*—Bipin Shalwala
*Assistant Examiner*—Afroza Y Chowdhury
(74) *Attorney, Agent, or Firm*—Harness, Dickey & Pierce, P.L.C.

(57) ABSTRACT

An output pulse of a flip flop is delayed in a delay inverter circuit before supplied to an input terminal of a level shifter. Then, an output pulse of the next stage flip flop is supplied to a reset terminal of the first flip flop and also to an enable terminal of the level shifter. Further, the level shifter output a sampling pulse with a beginning end equal to the beginning end of the pulse supplied to the input terminal and a terminal and equal to the beginning and of the pulse supplied to the enable terminal. With this arrangement, the subject invention provides a pulse output circuit, a driving circuit for a display device using the pulse output circuit, a display device and a pulse output method, that reduce delay of the terminal end of the pulse in sequentially outputting pulses from plural output terminals.

36 Claims, 30 Drawing Sheets

U.S. PATENT DOCUMENTS

| | | | | |
|---|---|---|---|---|
| 7,068,075 | B2 * | 6/2006 | Lim | 326/68 |
| 7,068,076 | B2 * | 6/2006 | Azami | 326/83 |
| 2002/0075249 | A1 * | 6/2002 | Kubota et al. | 345/204 |
| 2002/0083358 | A1 | 6/2002 | Otsuka | |
| 2003/0042536 | A1 | 3/2003 | Pulkin et al. | |
| 2003/0174115 | A1 * | 9/2003 | Washio et al. | 345/98 |

* cited by examiner

CONVENTIONAL ART

CONVENTIONAL ART

CONVENTIONAL ART

PULSE OUTPUT CIRCUIT, DRIVING CIRCUIT FOR DISPLAY DEVICE AND DISPLAY DEVICE USING THE PULSE OUTPUT CIRCUIT, AND PULSE OUTPUT METHOD

This Nonprovisional application claims priority under 35 U.S.C. §119(a) on Patent Application No. 2003/406293 filed in Japan on Dec. 4, 2003, and No. 2004/334768 filed in Japan on Nov. 18, 2004, the entire contents of which are hereby incorporated by reference.

FIELD OF THE INVENTION

The present invention relates to data-supplying signals for a display device, such as a liquid crystal display device.

BACKGROUND OF THE INVENTION

With the trend of reduction in current consumption, a logic-type input signal supplied from an IC tends to be lowered in voltage and thus generally converged to 3.3V or 5V. However, reduction in driving voltage of the drive circuit on the panel or in application voltage to liquid crystal to be less than the existing 8V or 12V can be achieved only by improvement in process or material, and therefore not easy. This means it is indispensable to carry out level shift of the input signal from IC. Accordingly, operation of the logic circuit on the panel or the liquid crystal driving circuit section requires a power-source-voltage level conversion circuit; otherwise, the driving have to be performed with a signal modified in voltage in the driver IC. In the former case, the circuit structure preferentially needs some kind of low current consumption strategy to reduce feed-through current as much as possible. This requires a larger number of Trs, making the internal delay more significant. The following describes such a liquid crystal display device having a level shifter on the panel.

First, a liquid crystal display device having a display panel 501 shown in FIG. 31 is described. The display panel 501 includes gate bus lines GL . . . , source bus lines SL . . . corresponding to RGB, and a pixel at each intersection of those bus lines GL and SL. When display is performed in the display panel 501, a source driver 503 writes a video signal to a pixel of the gate bus line GL selected by a gate driver 502, via the source bus lines SL. Note that, each pixel includes a liquid crystal capacitor, an auxiliary capacitor, and a TFT for fetching a video signal from the source bus line SL, one end of the respective auxiliary capacitors being connected one another by an auxiliary capacitor line called a Cs-Line.

The display panel 501 includes a sampling circuit block 501*a*, that is made up of analog switches ASW, provided for the respective source bus line SL, for sampling video signals, and control signal processing circuits (sampling buffer etc.) for the switches. The source driver 503 outputs signals (sampling pulse) indicating ON/OFF state of the sampling switch ASW for each group consisting of RGB source bus lines SL. Each of RGB lines has an individual video signal transmission line, allowing simultaneous but individual sampling for RGB from the switches ASW; however, in this example, a signal is fetched from a common video signal transmission line to the all sampling switches ASW of RGB. Note that, the sampling switches ASW may be controlled by a common sampling pulse, or by different pulses for RGB.

In a horizontal period, for example, the source bus line SL of R sequentially captures externally supplied video signals DATA by turning on the analog switches ASW (R1), . . . , ASW (Ri−1), ASW (Ri), ASW (Ri+1), . . . , that are connected to the source bus lines SL of R, in this order, by the sampling pulses. In this manner, sequential video signal writing is carried out.

FIG. 22 shows an arrangement example of the source driver 503 outputting sampling signals to the analog switches ASW (1), . . . , (i−1), (i), (i+1), . . . in this order.

As shown in the figure, a conventional source driver of a full-monolithic panel includes a shift register, and a level shifter that performs power-source-voltage conversion to drive the shift register. With this arrangement, the source driver produces sampling pulses for the analog switches ASW for each source bus line SL. The shift register is made of a plurality of set-reset flip-flops in cascade connection, denoted by SR-FF in the figure, each of the adjacent pair has a level shifter (denoted by LS) therebetween. The example shown in the figure is one corresponding to a group consisting of i, i+1, and i+2, but each of any other groups has one set-reset flip-flop and one corresponding level shifter. Hereinafter, the i-th set-reset flip-flop is expressed as a flip-flop FF (i), and the i-th level shifter is expressed as a LS (i).

The level shifter LS carries out power-source-voltage exchange when an active signal is supplied to an enable terminal ENA, and clock signals SCK and SCKB are supplied to the input terminals CK and CKB of the LS. The clock signals SCK and SCKB are opposite in phase. An output terminal OUTB is connected to an inversion set input terminal SB in the same group. The enable terminal ENA is connected to the output terminal Q in the immediately preceding stage. The input terminals CK and CKB are respectively supplied with one of the clock signals SCK and SCKB; for example, CK is supplied with SCK and CKB is supplied with SCKB, or other way round, depending on whether it is an odd numbered group or even numbered group. In this example, the clock signals CK and SCK are supplied to the input terminals CKB and SCKB of the level shifter LS(i), respectively. A reset terminal R of one flip-flop FF is connected to the output terminal Q of the flip-flop FF in the next stage.

In such a structure of the panel, the following explains a relation between the clock signal SCK and the output signal of the flip-flop FF with reference to FIG. 23. Hereinafter, output from the output terminal Q of the i-th flip flop FF is referred to as an output signal Q (i).

When the clock signal SCK rises from low level to high level and the clock signal SCKB falls from high level to low level while a high level, that is an active signal, is supplied to the enable terminal ENA of LS (i), the clock signal SCK, that has been converted in voltage and inverted in phase, is outputted from the output terminal OUTB. The output signal is supplied to the inversion set input terminal SB of the flip-flop FF (i), and an inversion signal, i.e., a high level is outputted as an output signal Q from the output terminal Q. Here, the level shifter LS (i+1) outputs a high level from the output terminal OUTB, and therefore the output signal Q (i+1) of the flip-flop FF (i+1) becomes low level. As a result, a low level is supplied to the reset terminal R of the flip-flop FF(i).

Next, when the clock signal SCK falls from high level to low level, and the clock signal SCKB rises from low level to high level, a low level is outputted from the output terminal OUTB of the level shifter LS (i+1), and therefore the output signal Q (i+1) of the flip-flop FF (i+1) becomes high level. As a result, a high level is supplied to the reset terminal R of the flip-flop FF (i) and the output signal Q (i) falls from high level to low level. The output signal Q (i+1) is kept at high level until a high level output signal Q (i+2) is supplied from the output terminal Q of the flip-flop FF (i+2) to the reset terminal R of the flip-flop FF (i+1) in the same manner.

Further, when the clock signal SCK rises from low level to high level and the clock signal SCKB falls from high level to low level while the output signal Q (i+1) is at high level, a low level is outputted from the output terminal OUTB of the flip-flop FF (i+2), and therefore the output signal Q (i+2) of the flip-flop FF (i+2) becomes high level.

In this manner, as shown in FIG. 23, the output pulses, i.e., the high level output signals Q (i), Q (i+1), and Q (i+2) are sequentially outputted in chronological order. More specifically, in a horizontal period of one of the gate bus line GL, the output pulses, i.e., the high level output signals Q (i), Q (i+1), and Q (i+2) are sequentially outputted. Such a signal output is performed simultaneously but individually for RGB.

However, as can be seen in the figure, the rise of the output signal Q (i) is delayed by a time Ta (delay time) from the rise of the clock signal SCK. The delay time Ta is sum of the internal delay time of the level shifter LS and the internal delay time of the flip-flop FF. Further, the fall of the output signal Q (i) is delayed by a time Tb, that is the internal delay time of the flip-flop FF, from the rise of the output signal Q (i+1). Accordingly, the Q (i) is delayed by Ta+Tb from the fall of the clock signal SCK. As a result, the fall state of the output signal Q (i) and the rise state of the output signal Q (i+1) are partly overlapped, where these signals are both at high level. Like so, the adjacent output pulses are overlapped with each other due to the delay times.

As mentioned above, the output pulses are used for sampling of video signals DATA. Therefore, if there are any overlapped periods, supply of the video signal DATA to the next stage source bus line and the pixel is started during the writing period (charging period) of the video signal DATA to the corresponding source bus line and the pixel thereof. As a result, the data writing for the next stage source bus line and the pixel is carried out in the writing period of the prior stage, thus failing proper writing to the pixel, and may result in some kind of display defect, such as ghost.

One conventional method of solving such a defect in display can be found in a prior art Document 1 (Japanese laid-open patent application Tokukaihei 11-272226, published on Oct. 8, 1999), the structure thereof is shown in FIG. 22, wherein a delay circuit delay is added to the output section to cause some delay of the output pulses of the output signals Q (1), . . . , Q (i), Q (i+1), Q (i+2), . . . , so that the rise of each output pulse is delayed on purpose, thus preventing the overlap. As shown in FIG. 24, the delay circuit delay causes delay of the output pulse using a NAND circuit that is supplied with the output signal Q (i) and the output signal Q having been through a plurality of inverters. With the use of this NAND circuit, as denoted by the waveform of SMP in FIG. 25, the rise of the sampling pulse is delayed from the rise of the output pulse.

Next to the delay circuit delay, there is provided a level shifter for converting the power-source voltage level according to the driving voltage of the analog switch ASW of the sampling circuit block 1*a*. In the example of FIG. 22, a voltage-driven level shifter LS-6Tr made up of 6 transistors is used as the level shifter, and the output signal of the LS-6Tr is used as a sampling pulse SMP. The sampling pulse SMP (i) is produced from the output pulse of the output signal Q (i).

Accordingly, the rise of the sampling pulse of FIG. 25 is delayed from the rise of the output pulse by a delay time Td-rise, that is equal to the delay time of the delay circuit delay+the delay time Td-rise of the level shifter LS-6Tr. Further, the fall of the sampling pulse is delayed from the output pulse by the delay time Td-fall in the level shifter LS-6Tr.

Further, Document 2 (Japanese Laid-Open Patent Applications Tokukaihei 05-216441 (published on Aug. 27, 1993)), Document 3 (Tokukaihei 05-241536 (published on Sep. 21, 1993)), and Document 4 (Tokukaihei 09-212133 published on Aug. 15, 1997) also describe methods of delaying the rise of a sampling pulse to be later than the fall of the immediately preceding sampling pulse.

As described, the conventional method causes some delay of the rise of the sampling pulse to avoid the overlap of the sampling pulses that interferes charging of the source bus lines or the pixels. However, with the development of high-resolution display, a larger number of gate bus lines or source bus lines are required for the same 1-frame driving, and therefore the charging of one source bus line has to be performed in a shorter time. Therefore, the shift register used in the gate driver or the source driver needs to be driven at high frequency.

As shown in FIG. 25, the fall of the sampling pulse have to occur within the data input valid period of the video signal DATA. Therefore, for example, if the sampling is set to complete at the mid-point of the video signal supplying period when there is no delay of the fall of the sampling pulse, it is necessary that the range of delay should fall within the later half of the video signal supplying period to properly carry out the sampling. This allowable range of the delay time is decreased as the frequency increases, but the same degree of internal delay occurs in the signals of the source driver even at a high-frequency drive. Therefore, even when the rise of the sampling pulse is delayed, there still is a possibility that the fall of the sampling pulse overlaps with the video signal supplying period of the next stage, unless the switching timing of the video signal in high frequency driving is changed. Particularly, the delay time Td-fall of the level shifter LS-6Tr, that is commonly used to convert the power-source voltage level, is relatively large. Therefore, the entire delay of the fall of the sampling pulse becomes more significant, thus more easily inducing the overlap the video signal supplying period in adjacent stages.

When the sampling time of the video signal DATA is shorter than the data input valid period, the sampling is properly carried out. On the other hand, when the sampling time of the video signal DATA is longer than the data input valid period, some writing defects, such as shifting in phase, or incomplete charging may occur. Accordingly, as shown in FIG. 25, the sampling margin, denoted by a difference between the fall of the sampling pulse and the ending timing of the data input valid period, needs to be given. Also, it is important to provide an interval between the sampling pulses that is denoted by the difference between the fall of the corresponding sampling pulse and the rise of the next-stage sampling pulse. When the rise of the sampling pulse of the next stage occurs before the fall of the sampling timing of the current stage, the sampling of the current stage may fail.

Besides, the load tends to increase as the number of pixels increase. Therefore, the charging condition of the source bus line becomes more severe, and there will be serious difficulties in reducing the charging time of the source bus line. Namely, in the foregoing example, assuming that some of the delay times are small because of the variation of delay time, there will be a difficulty in causing the fall of the sampling pulse before the mid-point of the video supplying period.

Therefore, reduction of the variation in the delay of the fall of the sampling pulse is required, meaning that the delay of the fall of the sampling pulse needs to be reduced.

Under such circumstances, reduction of the internal delay time and securement of the charging time are indispensable in a circuit design that deals with high-frequency driving.

SUMMARY OF THE INVENTION

The object of the present invention is to provide a pulse output circuit, a driving circuit for a display device using the pulse output circuit, a display device and a pulse output method, that reduce delay of the terminal end of the pulse in sequentially outputting pulses from plural output terminals.

In order to attain the foregoing object, the pulse output circuit according to the present invention is a pulse output circuit that sequentially outputs pulses from plural output terminals, the pulse output circuit producing a first pulse as a source pulse of a pulse outputted from each of the plural output terminals, and then modifying the first pulse in waveform by inverting a pulse level from a predetermined point to a terminal end and setting a predetermined level and polarity, so as to produce a second pulse as the pulse outputted from said each of the plural output terminals.

With this arrangement, each of the pulses sequentially outputted from the plural output terminals is the second pulse that is terminated before the terminal end of the first pulse, thereby reducing the delay of the terminal end of each pulse.

In order to attain the foregoing object, the driving circuit according to the present invention is a driving circuit of a display device and includes the foregoing pulse output circuit, for outputting a second pulse as a sampling pulse of a video signal for the display device.

With this arrangement, in the structure in which the sampling pulses are sequentially outputted from plural output terminals, the delay of the terminal end of each sampling pulse can be reduced, thereby properly sampling video signals.

In order to attain the foregoing object, the display device according to the present invention includes the foregoing driving circuit for a display device.

With this arrangement, a superior display can be performed due to appropriate sampling of video signals.

In order to attain the foregoing object, the pulse output method according to the present invention comprises the steps of: (a) producing a first pulse as a source pulse of a pulse outputted from each of the plural output terminals; and (b) producing a second pulse with a waveform equal to a waveform obtained by inverting a pulse level of the first pulse from a predetermined point to a terminal end and setting a predetermined level and polarity.

With this arrangement, each of the pulses sequentially outputted from the plural output terminals is the second pulse that is terminated before the terminal end of the first pulse, thereby reducing the delay of the terminal end of each pulse.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

The following explains one embodiment of the present invention with reference to FIGS. 1 through 7.

Figure 2:
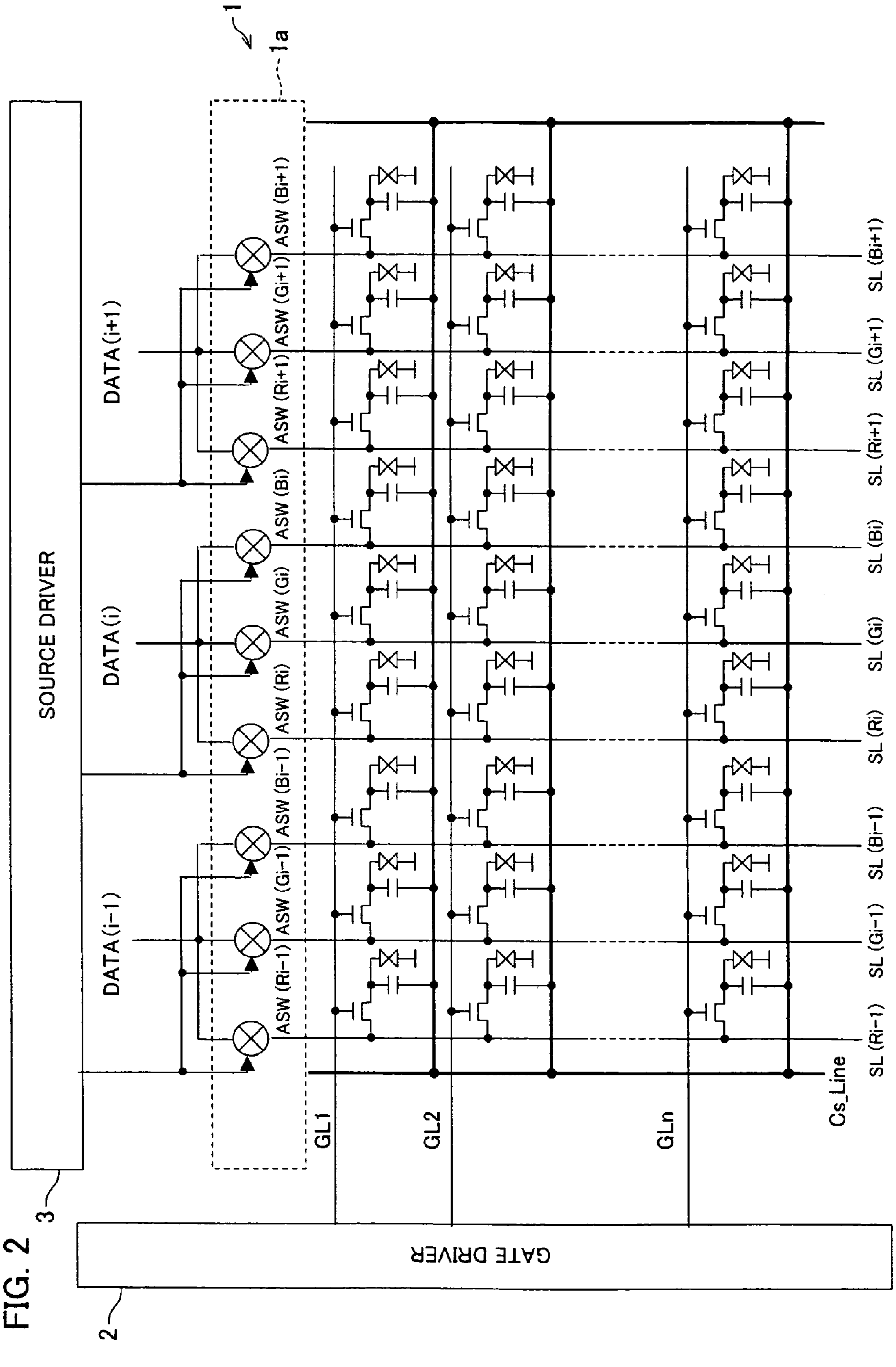
FIG. 2 is a block diagram illustrating a liquid crystal display device including the source driver of FIG. 1.

FIG. 2 shows a display panel 1 provided in a liquid crystal display device (the display device of the present embodiment), and the peripheral structure thereof. The display panel 1 includes gate bus lines GL . . . , source bus lines SL . . . corresponding to RGB, and a pixel at each intersection of those bus lines GL and SL. When display is performed in the display panel 1, a source driver writes a video signal to a pixel of the gate bus line GL selected by a gate driver 2, via the source bus line SL. Note that, each pixel includes a liquid crystal capacitor, an auxiliary capacitor, and a TFT for fetching a video signal from the source bus lines SL, one end of the respective auxiliary capacitors being connected one another by an auxiliary capacitor line called a Cs-Line.

The display panel 1 includes a sampling circuit block 1*a*, that is made up of analog switches ASW, provided for the respective source bus line SL, for sampling video signals, and control signal processing circuits (sampling buffer etc.) for the switches. The source driver 3 outputs signals (sampling pulse) indicating ON/OFF state of the sampling switch ASW for each group consisting of RGB source bus lines SL. Each of RGB lines has an individual video signal transmission line, allowing simultaneous but individual sampling for RGB from the switches ASW; however, in this example, a signal is fetched from a common video signal transmission line to the all sampling switches ASW of RGB. Note that, the sampling switches ASW may be controlled by a common sampling pulse, or by different pulses for RGB.

In a horizontal period, for example, the source bus line SL of R sequentially captures externally supplied video signals DATA by turning on the analog switches ASW (R1), . . . , ASW (Ri−1), ASW (Ri), ASW (Ri+1), . . . , that are connected to the source bus lines SL of R, in this order, by the sampling pulses. In this manner, sequential video signal writing is carried out.

In this manner, the source driver 3 outputs sampling signals to the analog switches ASW (1), . . . , (i−1), (i), (i+1), . . . in this order.

Figure 1:
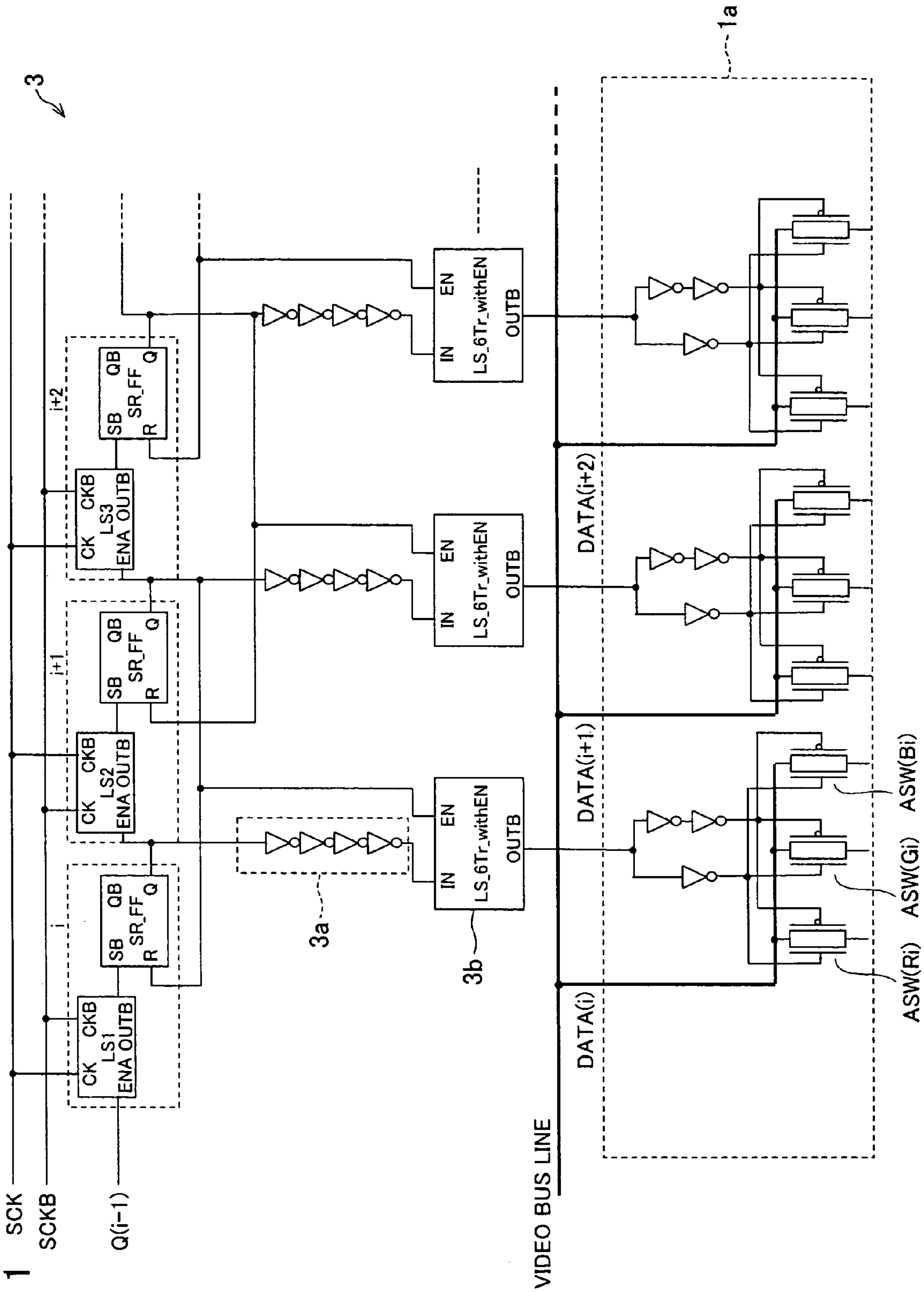
FIG. 1 is a circuit block diagram illustrating a structure of a source driver according to First Embodiment of the present invention.

FIG. 1 illustrates a structure of a source driver (pulse output circuit, driving circuit of the display device) 3. The figure only shows the structure corresponding to i-th, i+1-th and i+2-th groups. The source driver 3 includes a shift register SFT, and a level shifter LS that performs power-source-voltage exchange to drive the shift register. With this arrangement, the source driver 3 produces sampling pulses for the analog switches ASW for each source bus line SL.

The shift register SFT is made of a plurality of set-reset flip-flops, denoted by SR-FF in the figure, that are connected in a cascade manner, each of the adjacent pair has a level shifter (denoted by LS) therebetween. The example shown in the figure is one corresponding to a group consisting of i, i+1, and i+2, but each of any other groups has one set-reset flip-flop and one corresponding level shifter. Hereinafter, the i-th set-reset flip-flop is expressed as a flip-flop FF (i), and the i-th level shifter is expressed as a LS (i).

The level shifter LS carries out power-source-voltage exchange when an active signal is supplied to an enable terminal ENA, and clock signals SCK and SCKB are supplied to the input terminals CK and CKB of the LS. The clock signals SCK and SCKB are opposite in phase. Here, the power-supply-voltage exchange refers to level shift of an input signal with operation using a different power source voltage than that for producing the input signal. Since the level shifter LS is driven by a different power supply voltage than that of the circuit (not shown) for producing the clock signals SCK and SCKB, the signals supplied to the input terminals CK and CKB are changed in level before outputted when an active signal is supplied to the enable terminal ENA. Note that, the structure of the present embodiment also performs inversion of the input signal. An output terminal OUTB is connected to an inversion set input terminal SB in the same group. The enable terminal ENA is connected to the output terminal Q in the immediately preceding stage. The input terminals CK and CKB are respectively supplied with one of the clock signals SCK and SCKB; for example, CK is supplied with SCK and CKB is supplied with SCKB, or other way round, depending on whether it is an odd numbered group or even numbered group. In this example, the clock signals CK and SCK are supplied to the input terminals CKB and SCKB of the level shifter LS(i), respectively. A reset terminal R of one flip-flop FF is connected to the output terminal Q of the flip-flop FF in the next stage.

Figure 30:
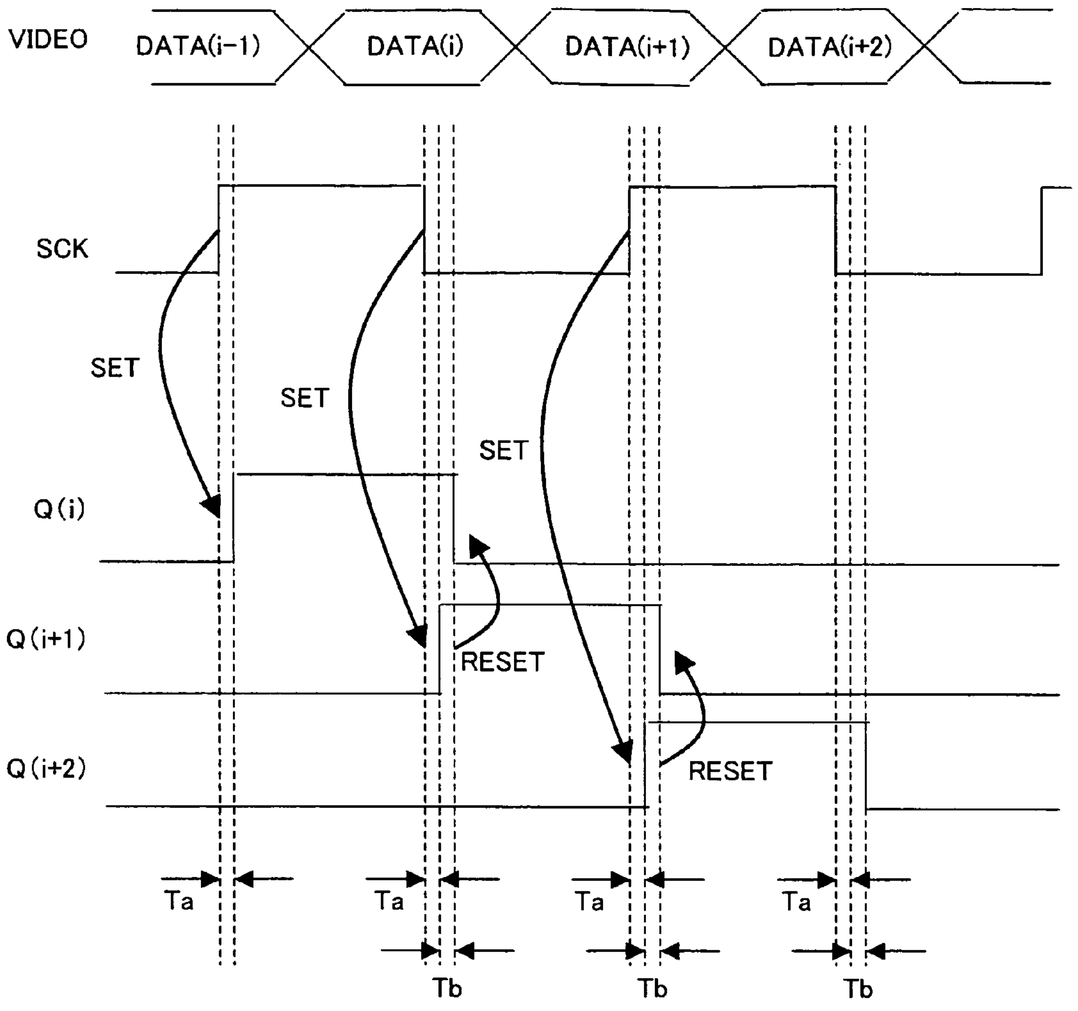
FIG. 30 is a timing chart showing output signals of flip-flops of the source driver of FIG. 1.
Figure 31:
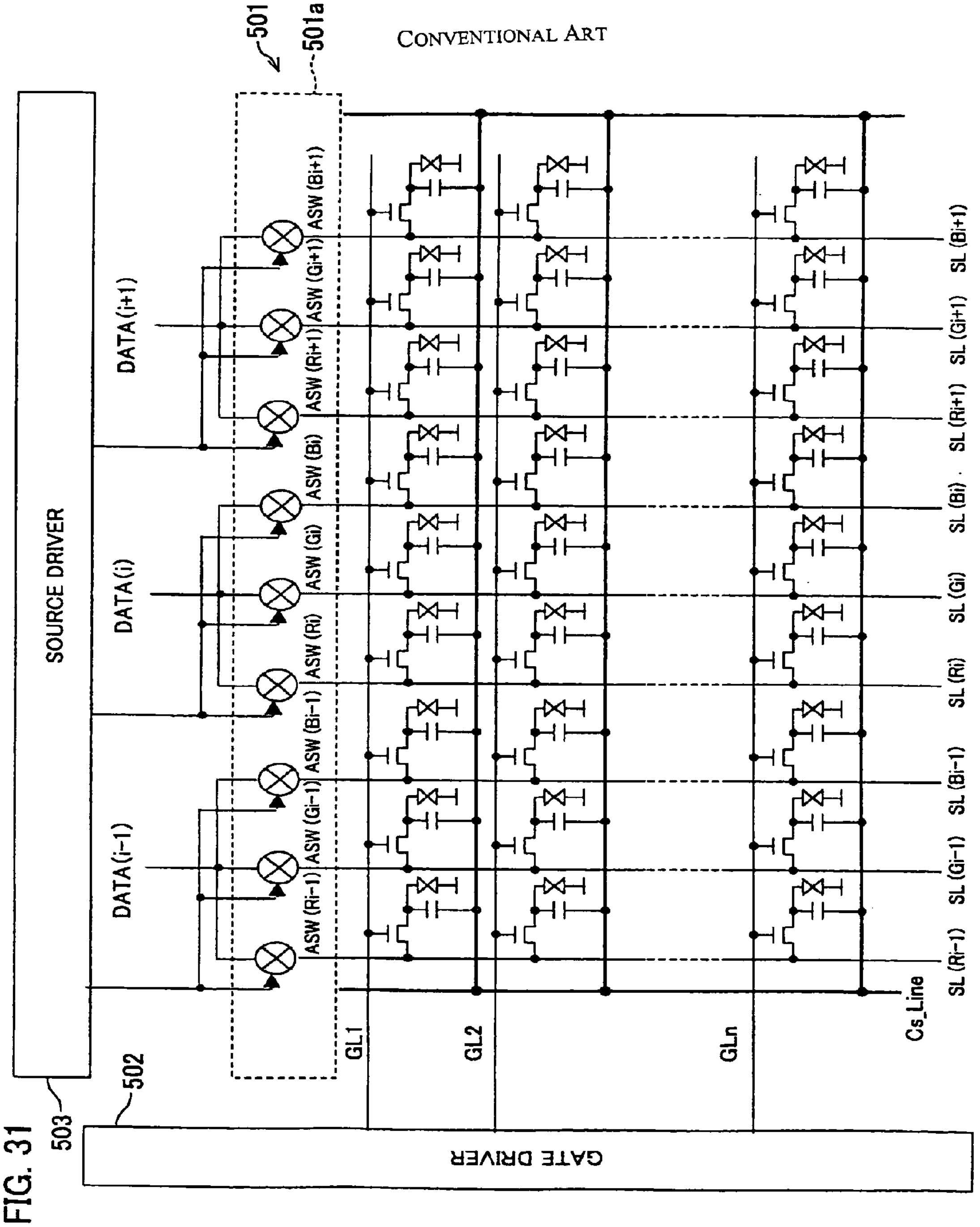
FIG. 31 shows a conventional structure of a liquid crystal display device that includes the source driver of FIG. 22.

In such a structure of the panel, the following explains a relation between the clock signal SCK and the output signal of the flip-flop FF with reference to FIG. 30. Hereinafter, output from the output terminal Q of the i-th flip flop FF is referred to as an output signal Q (i).

When the clock signal SCK rises from low level to high level and the clock signal SCKB falls from high level to low level while a high level, that is an active signal, is supplied to the enable terminal ENA of LS (i), the clock signal SCK, that has been converted in voltage and inverted in phase, is outputted from the output terminal OUTB. The output signal is supplied to the inversion set input terminal SB of the flip-flop FF (i), and an inversion signal, i.e., a high level is outputted as an output signal Q from the output terminal Q. Here, the level shifter LS (i+1) outputs a high level from the output terminal OUTB, and therefore the output signal Q (i+1) of the flip-flop FF (i+1) becomes low level. As a result, a low level is supplied to the reset terminal R of the flip-flop FF(i).

Next, when the clock signal SCK falls from high level to low level, and the clock signal SCKB rises from low level to high level, a low level is outputted from the output terminal OUTB of the level shifter LS (i+1), and therefore the output signal Q (i+1) of the flip-flop FF (i+1) becomes high level. As a result, a high level is supplied to the reset terminal R of the flip-flop FF (i) and the output signal Q (i) falls from high level to low level. The output signal Q (i+1) is kept at high level until a high level output signal Q (i+2) is supplied from the output terminal Q of the flip-flop FF (i+2) to the reset terminal R of the flip-flop FF (i+1) in the same manner.

Further, when the clock signal SCK rises from low level to high level and the clock signal SCKB falls from high level to low level while the output signal Q (i+1) is at high level, a low level is outputted from the output terminal OUTB of the flip-flop FF (i+2), and therefore the output signal Q (i+2) of the flip-flop FF (i+2) becomes high level.

In this manner, as shown in FIG. 30, the output pulses, i.e., the high level output signals Q (i), Q (i+1), and Q (i+2) are sequentially outputted in chronological order. More specifically, in a horizontal period of one of the gate bus line GL, the output pulses, i.e., the high level output signals Q (i), Q (i+1), and Q (i+2) are sequentially outputted. Such a signal output is performed simultaneously but individually for RGB.

Further, in addition to the level shifter and the shift register SFT above, the source driver 3 according to the present embodiment further includes a delay inverter circuit 3*a* and a level shifter 3*b* for each group. The delay inverter circuit 3*a* is made up of 4-stage cascade inverters and includes an input terminal connected to the output terminal Q of the flip-flop FF, as one of the flip flops constituting the shift register SFT, belonging to the same group as the delay inverter 3*a*. Further, the output terminal of the delay inverter circuit 3*a* is connected to the input terminal IN of the level shifter 3*b*. The level shifter 3*b* includes an enable terminal EN, that is connected to the output terminal Q of the next flip-flop FF of the flip flop FF belonging to the same group as the level shifter 3*b*, and is also connected to the reset terminal R of the flip flop FF in the corresponding stage. The level shifter 3*b* produces a sampling pulse, that is a driving pulse of the sampling circuit block 1*a*, based on the pulse supplied to the input terminal IN, and outputs the produced pulse from the output terminal OUTB. The sampling pulses of the respective groups are sequentially outputted from the separate output terminals OUTB.

Figure 3:
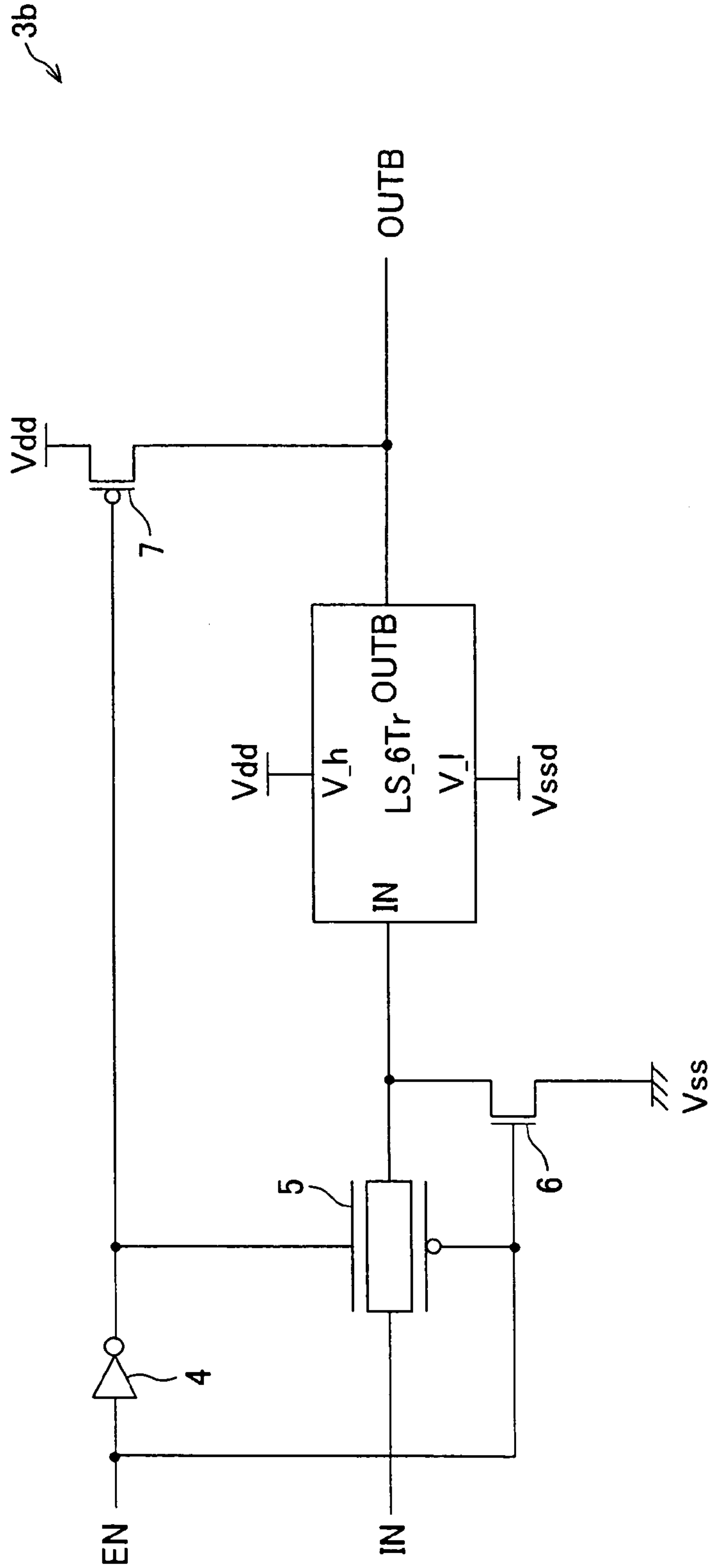
FIG. 3 is a circuit block diagram illustrating a structure of a level shifter provided in the source driver of FIG. 1 for outputting a sampling pulse.

FIG. 3 shows the structure of the level shifter 3*b*. The level shifter 3*b* includes a level shifter LS-6Tr, an inverter 4, an analog switch 5, an n-type TFT 6, and a p-type TFT 7.

Figure 5:
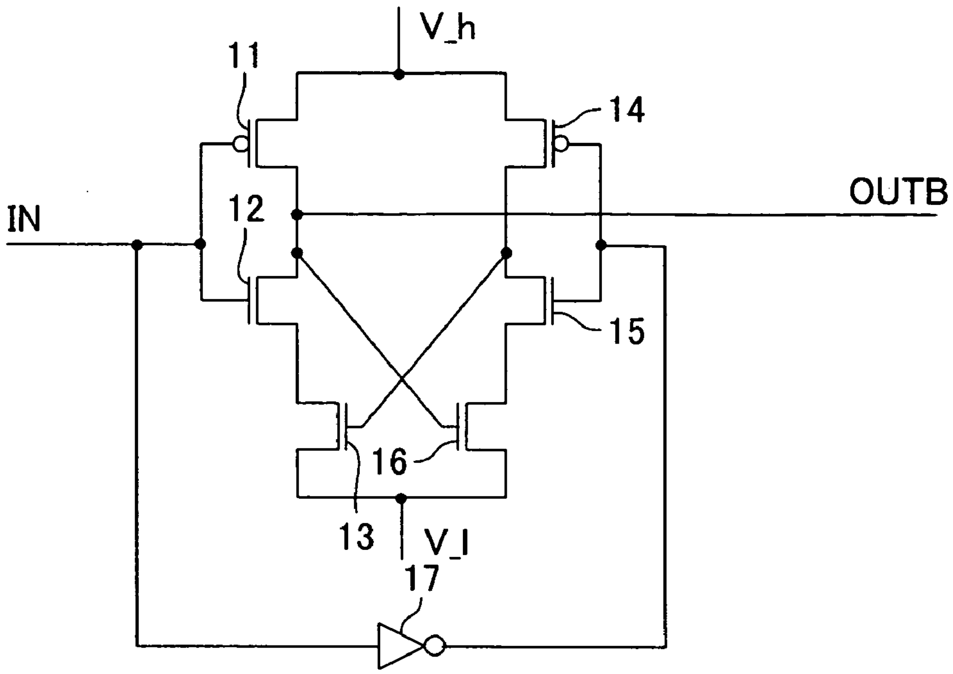
FIG. 5 is a circuit block diagram illustrating a structure of a level shifter provided in the level shifter of FIG. 3.

As shown in FIG. 5, the level shifter LS-6Tr is a voltage-driving type level shifter including 6 transistors. The structure will be described later. The input terminal IN of the level shifter LS-6Tr is connected to the input terminal IN of the level shifter 3*b* via the analog switch 5. The enable terminal EN is connected to the input terminal of the inverter 4, also to the gate of p-type TFT of the analog switch 5 and the gate of the TFT 6. The output terminal of the inverter 4 is connected to the gate of n-type TFT of the analog switch 5 and the gate of the TFT 7. Further, the drain of TFT 6 is connected to the input terminal IN of the level shifter LS-6Tr. The source of the TFT 6 is connected to a power source Vss. The source of TFT 7 is connected to a power source Vdd. The drain of the TFT 7 is connected to the output terminal OUTB of the level shifter LS-6Tr. The output terminal OUTB of the level shifter LS-6Tr also functions as the output terminal of the level shifter 3*b*. A high-level power source terminal V-h of the level shifter LS-6Tr is connected to Vdd, and a low-level power source terminal V-1 of the level shifter LS-6Tr is connected to Vssd. The level shifter LS-6Tr inverts a pulse supplied to the input terminal IN and processes the pulse so that the lower level end is equal to the level of the power source Vssd, and the higher level end is equal to the level of the power source Vdd. The resulting pulse is outputted from the output terminal OUTB.

The pulse outputted from the level shifter 3*b* is supplied to the sampling circuit block 1*a* as a sampling pulse. In the sampling circuit block 1*a*, the sampling signal passes through a predetermined number of inverters as control signal processing circuits of the analog switches ASW, before supplied to the respective gates of the p-type TFT and the n-type TFT of the analog switch 5. Note that, FIG. 1 illustrates only one analog switch 5 as a representative of respective analog switches of RGB.

Figure 4:
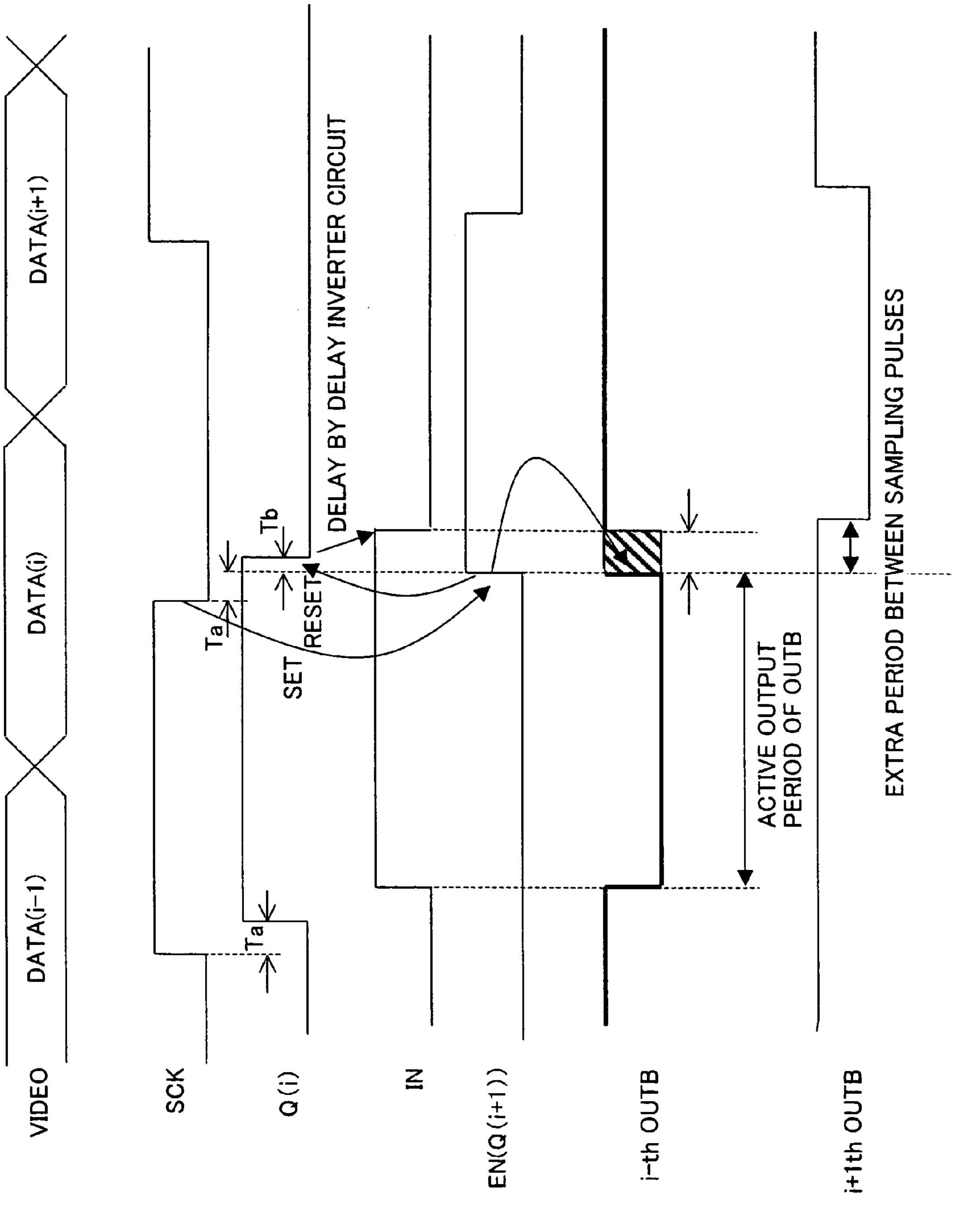
FIG. 4 is a timing chart showing operation of the source driver of FIG. 1.

FIG. 4 shows the driving signal of such a source driver. Due to the internal delay of the level shifter LS and the flip-flop FF, the output pulse of the flip-flop FF is delayed from the rising point of the clock signal SCK by the delay time Ta, that is equal to the amount of the internal delay. Such a delay may be seen in the output signal Q(i) in the figure. The output pulse is hereinafter referred to as a first pulse as the source pulse of the output pulse of the output terminal OUTB of the level shifter LS-Tr.

The output pulse of the flip-flop FF is supplied to the delay inverter circuit 3*a*, and is delayed before outputted to the input terminal IN of the level shifter 3*b*, as shown in IN in FIG. 4. Meanwhile, as shown in the figure with the signal waveform of the output signal Q (i+1), a low-level is supplied to the gate of TFT 6 of FIG. 3 and a high-level is supplied to the gate of TFT 7 until the pulse is outputted from the next stage flip-flop FF. Accordingly, the TFTs 6 and 7 are OFF, and the analog switch 5 is ON. Therefore, the signal supplied to the input terminal IN of the level shifter 3*b* is converted according to a power source voltage (power-source-voltage exchange) in the level shifter LS-6Tr and is outputted from the output terminal OUTB. More specifically, when a low level signal is supplied to the input terminal IN, a high-level, the level of the power source Vdd, is outputted from the output terminal OUTB, and when a high level signal is supplied to the input terminal IN, a low-level, the level of the power source Vssd, is outputted from the output terminal OUTB.

While the output signal Q of a flip-flop FF is at a high level, the output signal Q of the next stage flip-flop becomes high level. Accordingly, while the signal supplied to the input terminal IN of the level shifter 3*b* is at a high level, the output signal Q of the next stage becomes high level. Therefore, a high-level is supplied to the enable terminal EN of the level shifter 3*b*, and in the structure of FIG. 3, the analog switch 5 is turned off, and the TFT 6 and the TFT 7 are turned on. As a result, the power-source-voltage exchange of the output pulse that is performed by the level shifter LS-6Tr is stopped and the output terminal OUTB is pulled up to the level of the power source Vdd, thus outputting a high-level.

In this manner, a sampling pulse, shown as the signal waveform of the i-th output terminal OUTB of FIG. 4, is outputted from the output terminal OUTB of the level shifter 3*b*, which pulse is referred to as a second pulse. This second pulse starts falling when a certain time elapsed, that corresponds to the delay time of the delay inverter circuit 3*a*, after the rise of the output pulse of the corresponding flip-flop FF, and rises at the rising point, i.e., the beginning point of the output pulse (reference pulse) of the next-stage flip-flop FF. The output signal of the output terminal OUTB is active in a low level period.

Consequently, as denoted by the shaded-area in FIG. 4, the delay of the signal outputted from the output terminal OUTB is reduced by a time corresponding to the interval between the rise of the output pulse of the next stage flip-flop and the fall of the input signal supplied to the input terminal IN of the level shifter 3*b*. Further, the terminal end of the sampling pulse is earlier (the delay is reduced) than the terminal end of the output pulse (source pulse of the signal outputted from the output terminal OUTB) of the corresponding flip-flop FF by the time corresponding to the internal delay time Tb of the flip-flop FF.

In the present embodiment, since each reference pulse (the output pulse of the next-stage flip-flop FF) rises earlier than the first pulse (the output pulse of the corresponding flip-flop FF), the terminal end of the sampling pulse is determined according to the rising point of the corresponding reference pulse (the output pulse of the next flip-flop FF). This concept is also used in the later embodiments. In this arrangement, the sampling pulse, for example, for the output terminal OUTB of the i+1th level shifter 3*b*, is produced through modification of the waveform of the output pulse Q (i+1) in such a manner that the output pulse Q (i+1), that is a reference pulse of the sampling pulse of the output terminal OUTB of i-th level shifter 3*b*, in other words, the first pulse of the i+1th group, is delayed first, and this delayed output pulse Q (i+1) is used until the beginning end of the output pulse Q (i+2), that is a reference pulse of the sampling pulse of the output terminal OUTB of the i+1th level shifter 3*b*; further, after the beginning end, an inversion signal of the pulse level of the delayed output pulse Q (i+1) is supplied. In this way, by using the delayed output pulse Q (i+1) and supplying the inversion level not related to the delay of the output pulse Q (i+1), the sampling pulses not overlapped with each other may be easily formed.

Further, with such an arrangement, the foregoing method produces a sampling pulse by performing the waveform modification of the output pulse of the flip-flop so that the level from the terminal end of the output pulse of the corresponding flip-flop FF to the beginning end of the output pulse of the next-stage flip-flop FF is inverted to be opposite to the pulse level, and then deciding an appropriate level and polarity of the output pulse as the output signal of the output terminal OUTB. In this embodiment, the process of setting the level and polarity, and the process of waveform modification of the output pulse are performed at the same time, but they may be performed separately. Further, in the present embodiment, the output pulse of the flip-flop FF is modified to a predetermined level by the level shifter LS-6Tr; however, the output signal may have the same predetermined level as that of the output pulse of the flip-flop FF without being subjected to level shift. Further, in the present embodiment, the sampling pulse is at a low level when the output pulse of the flip-flop FF is at a high level, that is, they are opposite in level; however, they may be both at a low level or at a high level in the same polarity. These concepts are also used in the later embodiments.

In this manner, as with the signal waveform of the i+1th output terminal OUTB in FIG. 4, it is possible to use a sampling pulse that rises with a sufficient interval before the fall of the sampling pulse of the next stage. With such a sampling pulse, the delays from the clock signals SCK and SCKB, that are synchronized signal with the operation of the source driver 3, are reduced, thus making sufficient time between the switching of the video signal DATA and the rise of the sampling pulse. Therefore, the sampling of the video signal DATA can be properly performed while ensuring sufficient charging time of the source bus line SL and pixel in a high-frequency drive. Accordingly, a superior display can be realized in a liquid crystal display device.

Here, with reference to FIG. 5; the following explains the structure of the level shifter LS-6Tr of FIG. 3.

As shown in FIG. 5, the level shifter LS-6Tr includes a p-type TFTs 11 and 14, n-type TFTs 12, 13, 15 and 16, and an inverter 17.

The respective gates of the TFTs 11 and 12 are connected to the input terminal IN of the level shifter LS-6Tr. Further, the input terminal of the inverter 17 is also connected to the input terminal IN of the level shifter LS-6Ts, and the output terminal of the inverter 17 is connected to the respective gates of the TFTs 14 and 15. The sources of the TFTs 11 and 14 are connected to a high-level power source terminal V-h, while the sources of the TFTs 13 and 16 are connected to a low-level voltage terminal V-1. The drains of the TFTs 11 and 12 are connected to each other, the junction of those is further connected to the output terminal OUTB of the level shifter LS-6Tr. The drains of the TFTs 12 and 13 are connected to each other. The drains of the TFTs 14 and 15 are connected to each other. The source of the TFT 15 and the drain of TFT 16 are connected to each other. The gate of the TFT 13 is connected to the junction of the TFTs 14 and 15. The gate of the TFT 16 is connected to the junction of the TFTs 11 and 12.

Figure 6:
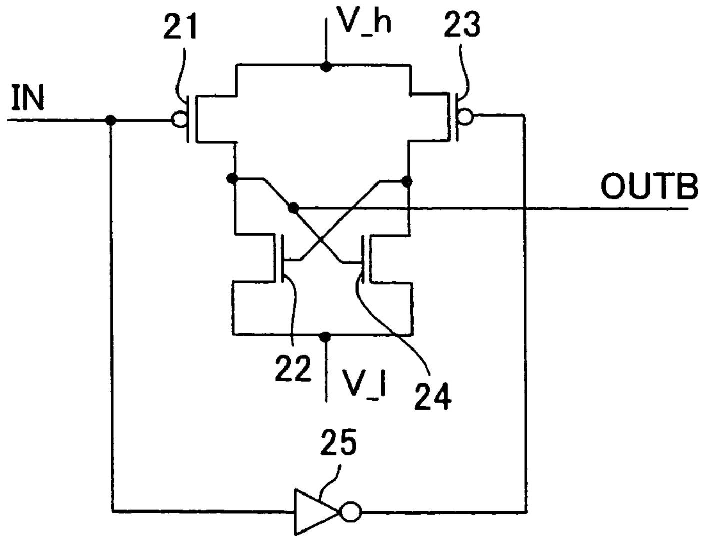
FIG. 6 is a circuit block diagram illustrating a substitute level shifter for the level shifter of FIG. 5, to be mounted to the level shifter of FIG. 3.

FIG. 6 shows another level shifter that can be a substitute of the level shifter LS-6Tr. The level shifter of FIG. 6 is a voltage-driven level shifter made up of 4 transistors. This level shifter includes a p-type TFTs 21 and 23, n-type TFTs 22 and 24, and an inverter 25.

The gate of the TFT 21 is connected to the input terminal IN. Further, the input terminal of the inverter 25 is also connected to the input terminal IN, and the output terminal of the inverter 25 is connected to the gate of the TFT 23. The sources of the TFTs 21 and 23 are connected to a high-level power source terminal V-h, while the sources of the TFTs 22 and 24 are connected to a low-level voltage terminal V-1. The drains of TFTs 21 and 22 are connected to each other, the junction of those is connected to the output terminal OUTB. The drains of TFTs 23 and 24 are connected to each other. The gate of TFT 22 is connected to the junction of the TFTs 23 and 24. The gate of the TFT 24 is connected to the junction of the TFTs 21 and 22.

Figure 7:
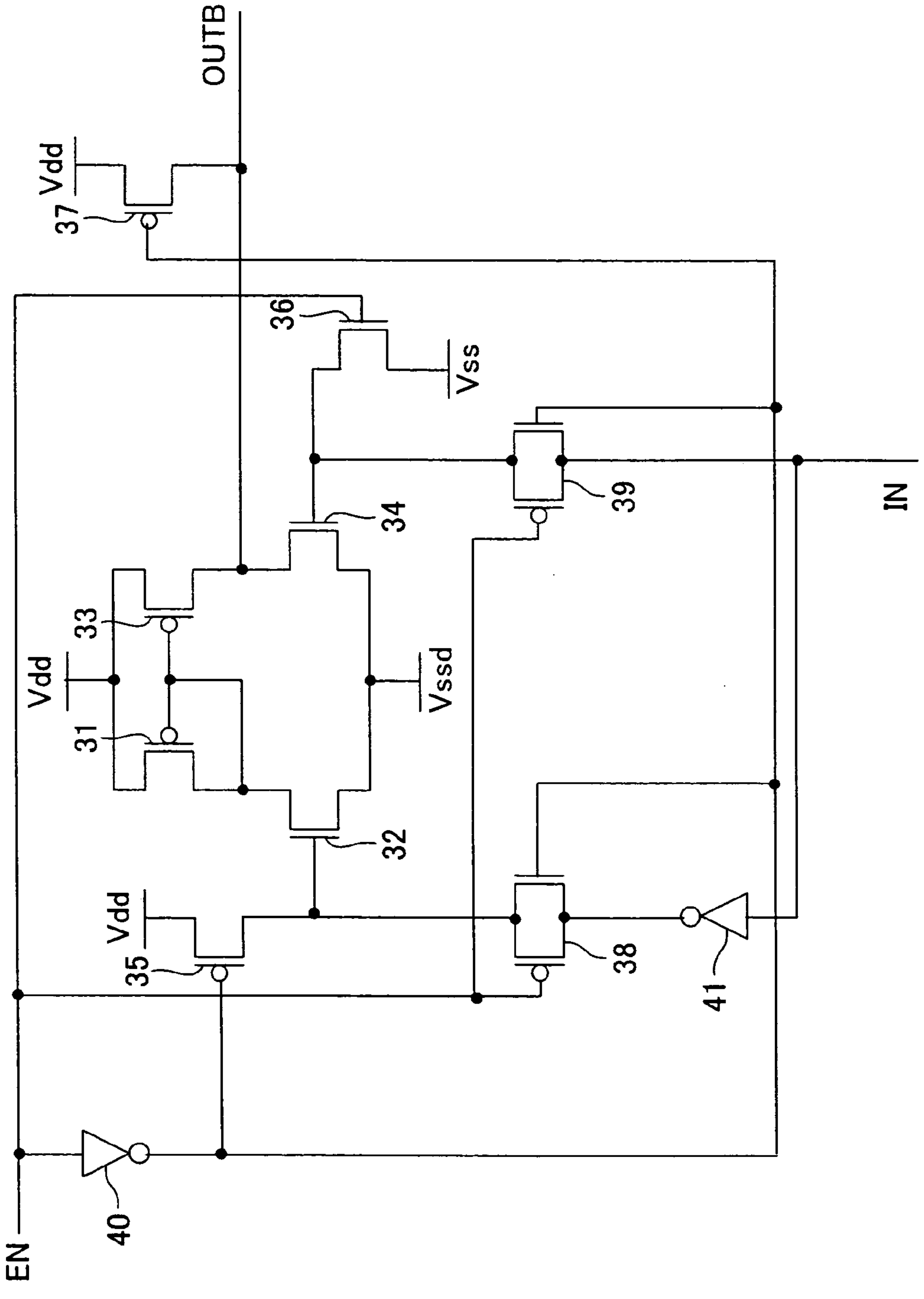
FIG. 7 is a circuit block diagram illustrating a substitute level shifter for the level shifter of FIG. 3.

FIG. 7 shows another level shifter that can be a substitute of the level shifter 3*b* of FIG. 3.

The level shifter of FIG. 7 is a current-driven level shifter including p-type TFTs 31, 33, 35, and 37, n-type TFTs 32, 34 and 36, analog switches 38 and 39, and inverters 40 and 41.

The input terminal IN is connected to the gate of the TFT 34 via the analog switch 39. Further, the input terminal IN is connected to the gate of the TFT 32 and the drain of the TFT 35 via first the inverter 41 and then the analog switch 38. The enable terminal EN is connected to the gate of the TFT 36 and to the gate of the p-type TFT of the analog switch 38. The enable terminal EN is further connected to the respective gates of the TFTs 35 and 37 via the inverter 40. The sources of the TFTs 31, 33, 35 and 37 are connected to the power source Vdd, while the sources of the TFTs 32 and 34 are connected to the power source Vssd. The source of the TFT 36 is connected to the power source Vss.

The respective gates of the TFTs 31 and 33 are connected to each other, the junction of those is connected to the drain of the TFT 31. The drains of TFTs 31 and 32 are connected to each other. The drains of TFTs 33 and 34 are connected to each other, the junction of those is connected to the output terminal OUTB. The drain of TFT 37 is also connected to the output terminal OUTB.

The present embodiment has described a structure for pulling up the output terminal; however, the structure can be modified to pull down the output terminal OUTB when the sampling pulse is opposite in polarity. This modification is also effective in the later embodiments.

Second Embodiment

Figure 8:
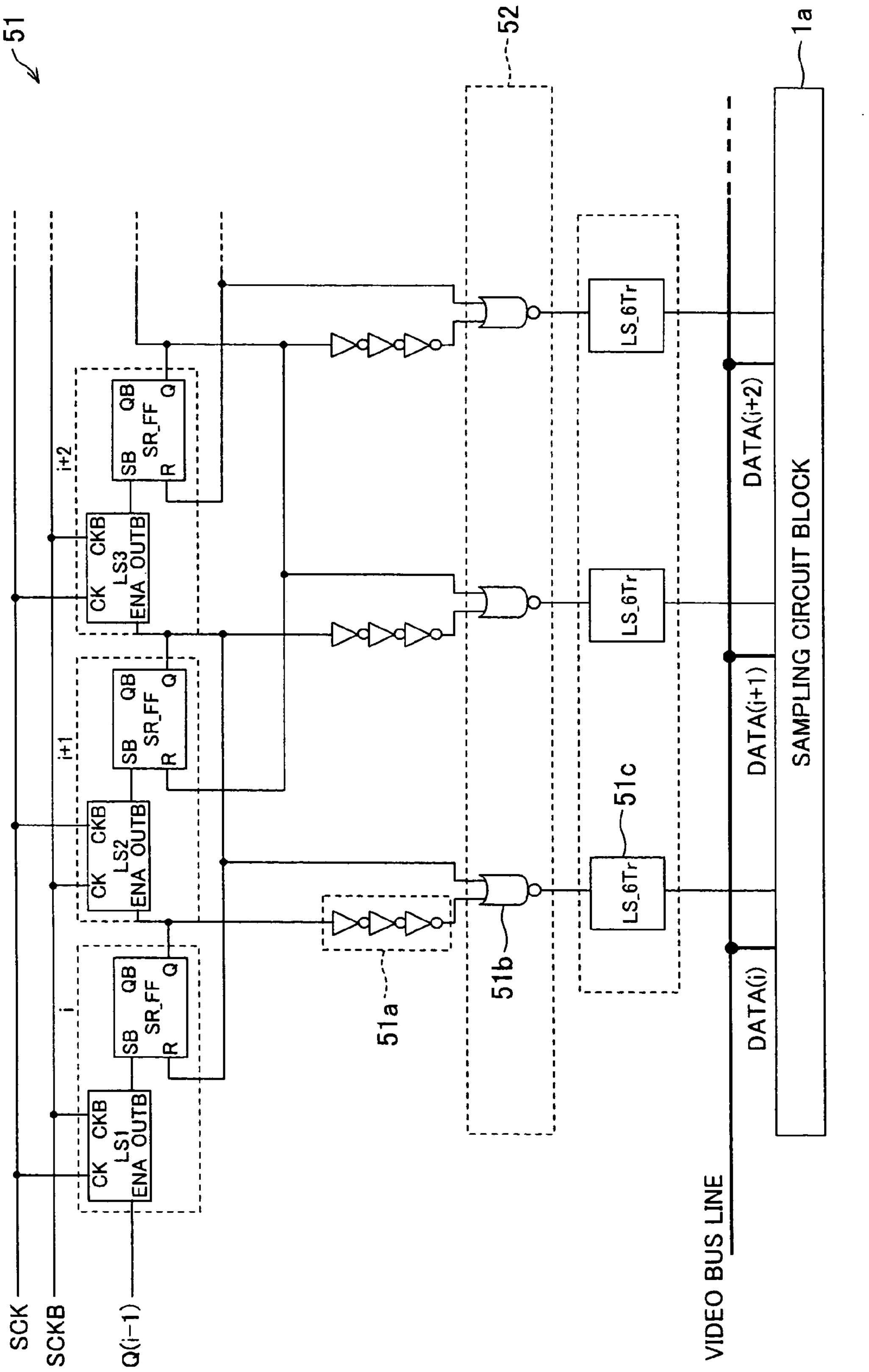
FIG. 8 is a circuit block diagram illustrating a structure of a source driver according to Second Embodiment of the present invention.

The following explains another embodiment of the present invention with reference to FIG. 8. For ease of explanation, materials having the equivalent functions as those shown in the description of First Embodiment above will be given the same reference symbols, and explanation thereof will be omitted here.

FIG. 8 shows a source driver 51 provided in a liquid crystal display device (the display device of the present embodiment), and the peripheral structure thereof. Apart from them, the liquid crystal display device further includes the display panel 1 and the gate driver 2 identical to those in First Embodiment.

The source driver 51 of FIG. 8 includes delay inverter circuits 51*a*, NORs 51*b* and level shifters 51*c*, one each for a group, instead of the delay inverter circuits 3*a* and the level shifters 3*b* of the source driver 3 shown in FIG. 1. The NORs 51*b* constitute a logic section 52. The level shifter 51*c*, made up of a level shifter LS-6Tr including 6 transistors, may be omitted when the logic section 52 and the sampling circuit block 1*a* are identical in power source potential. Note that, the NOR 51*b* is a general NOR circuit for carrying out NOR calculation, but the polarity of the output here and those in the later embodiment are made only for ease of explanation.

The delay inverter circuit 51*a* is made up of three cascade inverters, and is supplied with an output signal Q of the corresponding flip-flop FF. Each NOR 51*b* is supplied with an output signal of the delay inverter circuit 51*a* and an output signal of the next stage flip-flop FF. The output signal of the NOR 51*b* is subjected to power-source-voltage exchange in the level shifter 51*c* before outputted to the sampling circuit block 1*a*. When a pulse is outputted from the corresponding flip-flop FF, the pulse is delayed in the delay inverter circuit 51*a*; however, when the next stage flip-flop FF outputs a pulse, the NOR 51*b* outputs a pulse that falls at the rising point of the output pulse of the next stage flip-flop. As a result, as in First Embodiment, the delay of the first pulse, that is the sampling pulse of the corresponding flip-flop, is reduced from the terminal end of the output pulse of the same flip-flop FF by the internal delay time Tb of the flip-flop FF.

When the driver includes the level shifter 51*c*, the output pulse of the NOR 51*b* is subjected to power source conversion before outputted to the sampling circuit block 1*a* as the sampling pulse, that is the second pulse. When the driver does not include the level shifter 51*c*, the output pulse of the NOR 51*b* is outputted without modification to the sampling circuit block 1*a* as the sampling pulse (the second pulse).

With such an arrangement, the foregoing method modifies the waveform of the output signal Q (i+1), that is the first pulse, using a logic calculation of the output pulse Q (1+1), i.e., the reference pulse of the i-th sampling pulse produced by delaying the i+1th first pulse, and the output pulse Q (i+2), i.e., a reference pulse of the i+1-th sampling pulse so as to produce the i+1th sampling pulse. The logic calculation may be based on OR, or AND logic; otherwise, a logic element such as an analog switch may be used. With this method, it is possible to produce the second pulse not overlapped with each other only by using pulse logic.

Third Embodiment

Figure 9:
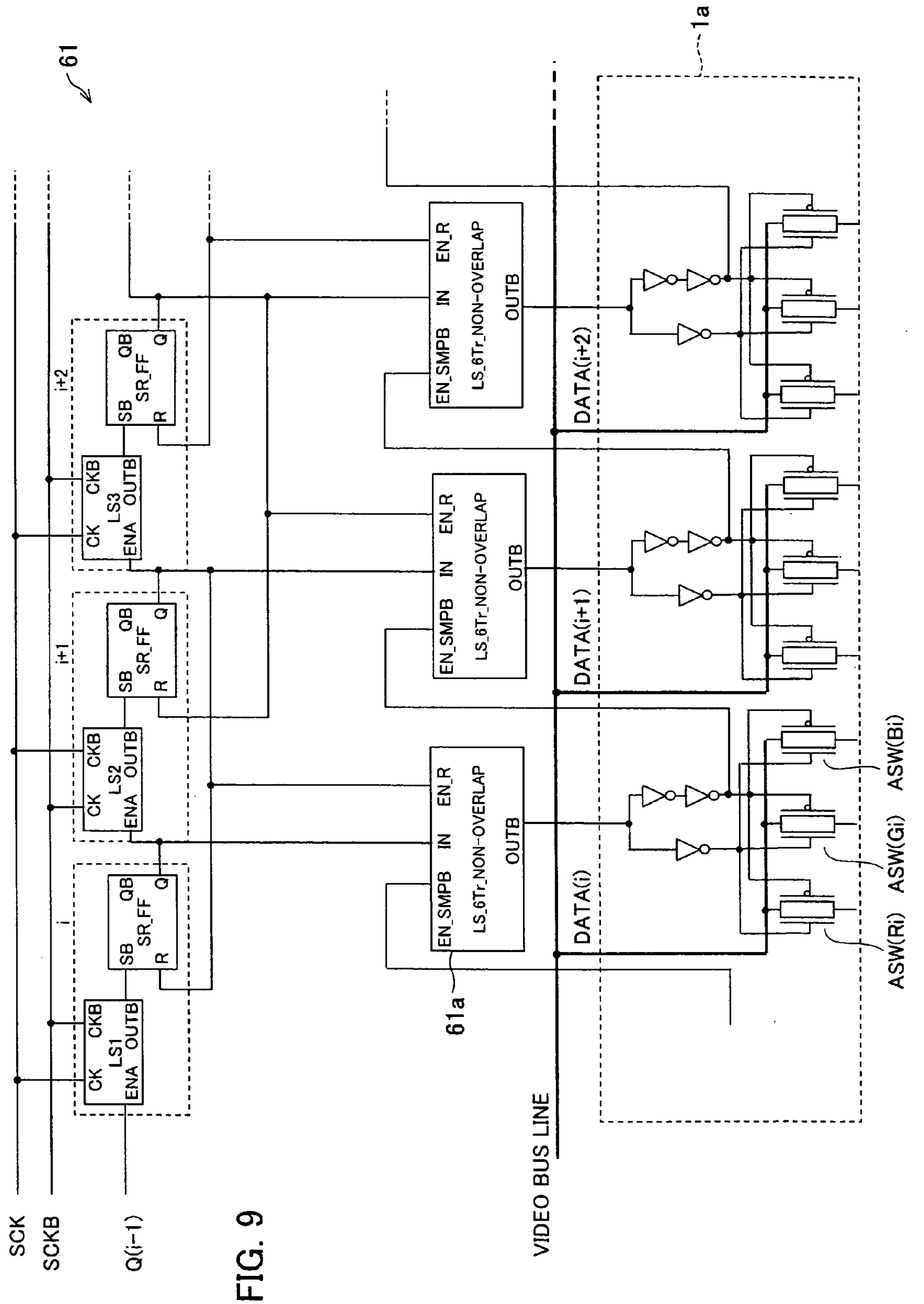
FIG. 9 is a circuit block diagram illustrating a structure of a source driver according to Third Embodiment of the present invention.
Figure 12:
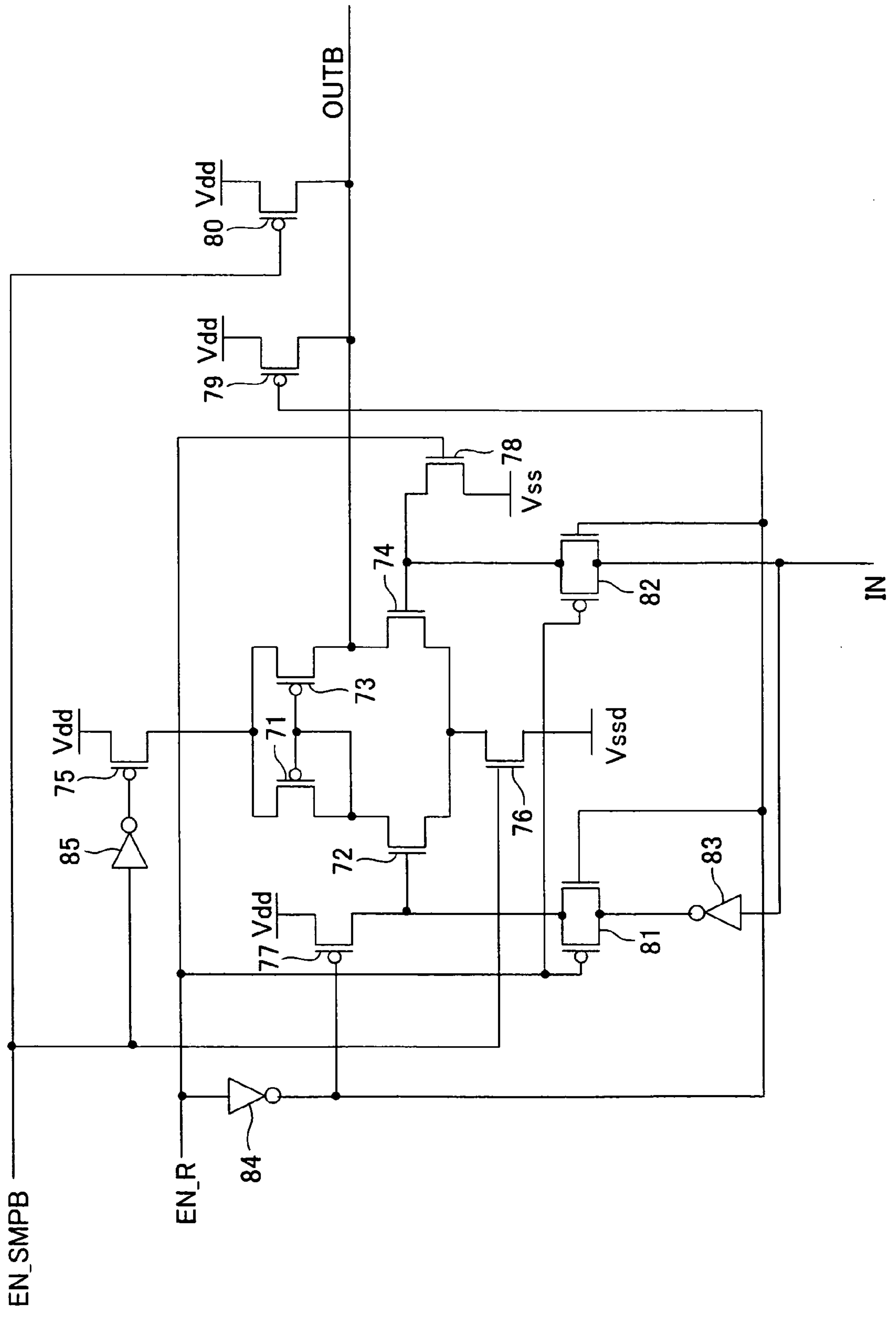
FIG. 12 is a circuit block diagram illustrating a structure of a substitute level shifter for the non-overlap circuit of FIG. 10.

The following explains still another embodiment of the present invention with reference to FIGS. 9 and 12. For ease of explanation, materials having the equivalent functions as those shown in the description First and Second Embodiments above will be given the same reference symbols, and explanation thereof will be omitted here.

FIG. 9 shows a source driver 61 provided in a liquid crystal display device (the display device of the present embodiment), and the peripheral structure thereof. Apart from them, the liquid crystal display device further includes the display panel 1 and the gate driver 2 identical to those in First Embodiment.

The source driver 61 of FIG. 9 includes a non-overlap circuit 61*a* for each group, instead of the delay inverter circuit 3*a* and the level shifter 3*b* of the source driver 3 of FIG. 1. The input terminal IN of the non-overlap circuit 61*a* is supplied with an output signal of the flip-flop FF of the corresponding stage. Further, the non-overlap circuit 61*a* includes an enable terminal EN-SMPB that is supplied with the output signal from the output terminal OUTB of the immediately preceding stage non-overlap circuit 61*a* via a sampling buffer circuit (in the present embodiment, a two-stage cascade inverter) that is used for controlling the p-type TFT of the analog switch ASW constituting the sampling circuit block 1*a*. Further, the non-overlap circuit 61*a* includes an enable terminal EN-R that is supplied with an output signal of the next-stage flip-flop FF.

The output signal from OUTB is supplied to the sampling circuit block 1*a*, and further supplied to the respective gates of the n-type TFT and the p-type TFT via the sampling buffer circuit as thus mentioned. These gate signals are also supplied to the enable terminal EN-SMPB of the next-stage non-overlap circuit 61*a*.

Figure 10:
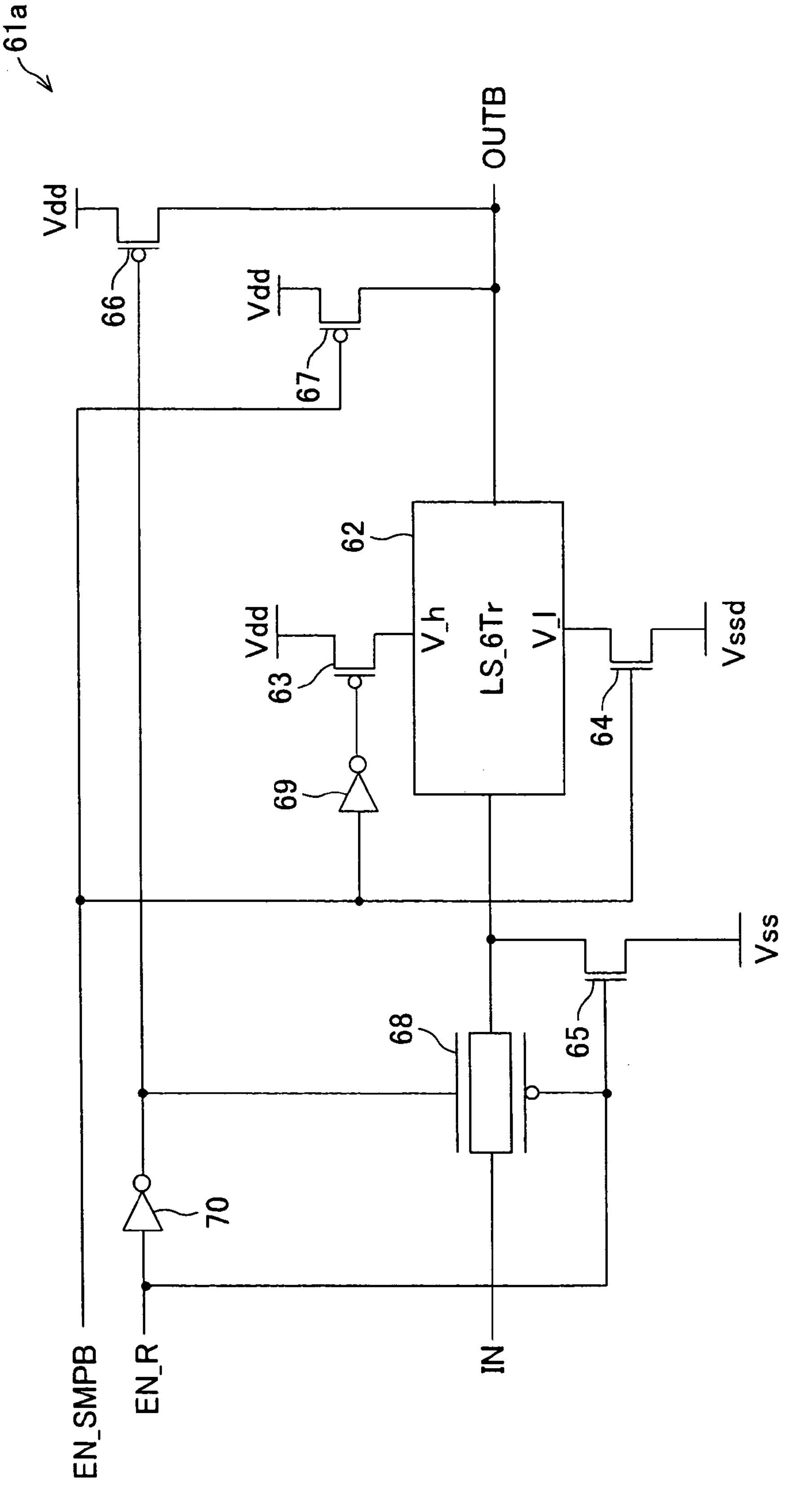
FIG. 10 is a circuit block diagram illustrating a structure of a non-overlap circuit provided in the source driver of FIG. 9.

FIG. 10 shows a structure of the non-overlap circuit 61*a*. The non-overlap circuit 61*a* includes a level shifter 62, a p-type TFTs 63, 66, and 67, n-type TFTs 64 and 65, an analog switch 68, and inverters 69 and 70.

The level shifter 62 is a voltage-driving type level shifter shown in FIG. 5 including 6 transistors. The high-level power source terminal V-h of the level shifter is connected to the power source Vdd via the TFT 63, and the low-level power source terminal V-1 is connected to the power source Vssd via the TFT 64. The input terminal IN is connected to the input terminal of the level shifter 62 via the analog switch 68. The enable terminal EN-R is connected to the gate of the n-type TFT of the analog switch 68 via the inverter 70, and also connected to the gate of the p-type TFT of the analog switch 68. Further, the enable terminal EN-R is connected to the gate of the TFT 65, and also connected to the gate of the TFT 66 via the inverter 70.

The drain of the level shifter 65 is connected to the input terminal of the level shifter 62, while the source is connected to the power source Vss. The enable terminal EN-SMPB is connected to the gate of the TFT 63 via the inverter 69, and also connected to the gate of the TFT 64. The enable terminal EN-SMPB is further connected to the gate of the TFT 67. The sources of TFTs 66 and 67 are connected to the power source Vdd, while the drains are connected to the output terminal of the level shifter 62, that is, the output terminal OUTB of the non-overlap circuit 61*a*.

Figure 11:
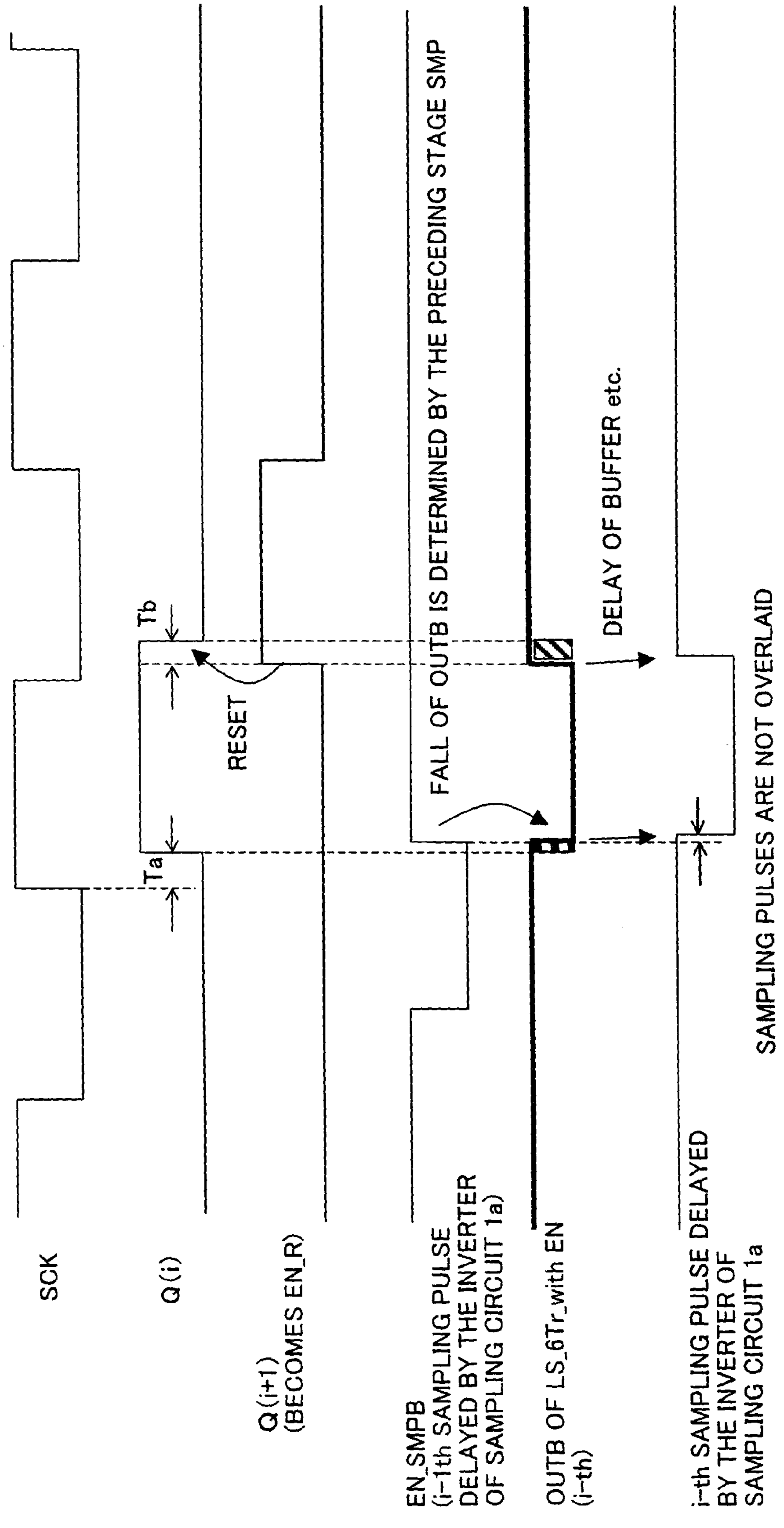
FIG. 11 is a timing chart showing operation of the source driver of FIG. 9.

The following explains sampling pulse production operation in the foregoing structure with reference to FIG. 11.

As can be seen in the signal waveform of the output signal Q(i), when an output pulse is outputted from a flip-flop FF, as described more in detail below, the sampling pulse of the immediately preceding stage is delayed in the inverter of the sampling circuit block 1*a*, and a low-level is supplied to the enable terminal EN-SMPB. Further, as can be seen in the signal waveform of the output signal Q (i+1), a low-level is supplied to an enable terminal EN-R. Accordingly, the analog switch 68 is turned on and the output pulse is supplied to the level shifter 62; however, the power source is blocked, and the TFT 67 is turned on. As a result, the output terminal OUTB outputs a voltage level of the power source Vdd.

Then, when the sampling pulse of the immediately preceding stage is delayed in the inverter of the sampling block 1*a*, and a high-level is supplied to the enable terminal EN-SMPB, the TFTs 63 and 64 are turned on and the TFTs 66 and 67 are turned off. As a result, the level shifter 62 changes the voltage of the pulse supplied from the input terminal IN to the voltage of power source Vdd before outputting the pulse from the output terminal OUTB.

Then, when an output pulse is outputted from the next-stage flip-flop FF as shown in the signal waveform of the output signal Q (1+1), the analog switch 68 is turned off and the TFTs 65 and 66 are turned on. As a result, the output terminal OUTB outputs a voltage level of the power source Vdd.

Consequently, as with First Embodiment, by using the output pulse of the next stage flip flop FF as a reference pulse, the delay of the resulting output sampling pulse (first pulse) is reduced from the terminal end of the output pulse of the corresponding flip flop FF by a time corresponding to the internal delay Tb of the flip-flop FF. Further, the sampling pulse is delayed in the inverter of the sampling circuit block 1*a* before supplied to the next stage non-overlap circuit 61*a*. Also, the sampling pulse of the immediately preceding stage is delayed and supplied to the corresponding stage. Like so, the adjacent sampling pulses, for example, the i−1th sampling pulse and the i-th sampling pulse in FIG. 11 are not overlapped with each other.

As described, in the present embodiment, the sampling pulse of the i+1th group is produced in such a manner that the i-th sampling pulse is delayed first, and the output pulse Q (i+1), that is a reference pulse of the i-th sampling pulse, is used from the terminal end of the delayed i-th sampling pulse to the beginning end of the output pulse Q (i+2), that is a reference pulse of the i-th sampling pulse. Further, after the beginning end, an inversion signal of the pulse level of the output pulse Q (i+1) (first pulse) is given to modify the waveform of the output pulse Q (i+1).

In this way, by using the delayed immediately preceding stage sampling pulse and the next stage output pulse, and supplying the inversion level not related to the delay of the output pulse of the corresponding output pulse, it is possible to easily produce sampling pulses not overlapped with each other.

FIG. 12 shows a current-driven level shifter that can be a substitute of the non-overlap circuit 61*a* of FIG. 10.

This level shifter includes p-type TFTs 71, 73, 75, 77, 79 and 80, n-type TFTs 72, 74, 76, 78, analog switches 81 and 82, and inverters 83, 84 and 85.

The input terminal IN is connected to the gate of the TFT 74 via the analog switch 82, and also connected to the gate of the TFT 72 and the drain of the TFT 77 via of the inverter 83 and the analog switch 81 in this order. The enable terminal EN-R is connected to the gate of the TFT 78 and to the gates of the p-type TFTs of the analog switches 81 and 82, and also connected to the gate of the TFT 79 and the gates of the n-type TFTs of the analog switches 81 and 82 via the inverter 84. The enable terminal EN-SMPB is connected to the gates of TFTs 76 and 80, and is also connected to the gate of the TFT 75 via the inverter 85.

The respective sources of the TFTs 75, 77, 79 and 80 are connected to the power source Vdd, the sources of the TFTs 76 and 78 are connected to the power sources Vssd and Vss, respectively. The sources of the TFTs 71 and 73 are connected to the drain of the TFT 75. The gates of TFTs 71 and 73 are connected to each other, and are connected to the drain of the TFT 71. The drains of the TFT 71 and the TFT 72 are connected to each other. The drains of the TFT 73 and the TFT 74 are connected to each other, the junction thereof is connected to the output terminal OUTB. The sources of the TFTs 72 and 74 are connected to the drain of the TFT 76. The drain of TFT 78 is connected to the gate of the TFT 74. The drains of the TFTs 79 and 80 are connected to the output terminal OUTB.

Fourth Embodiment

Figure 13:
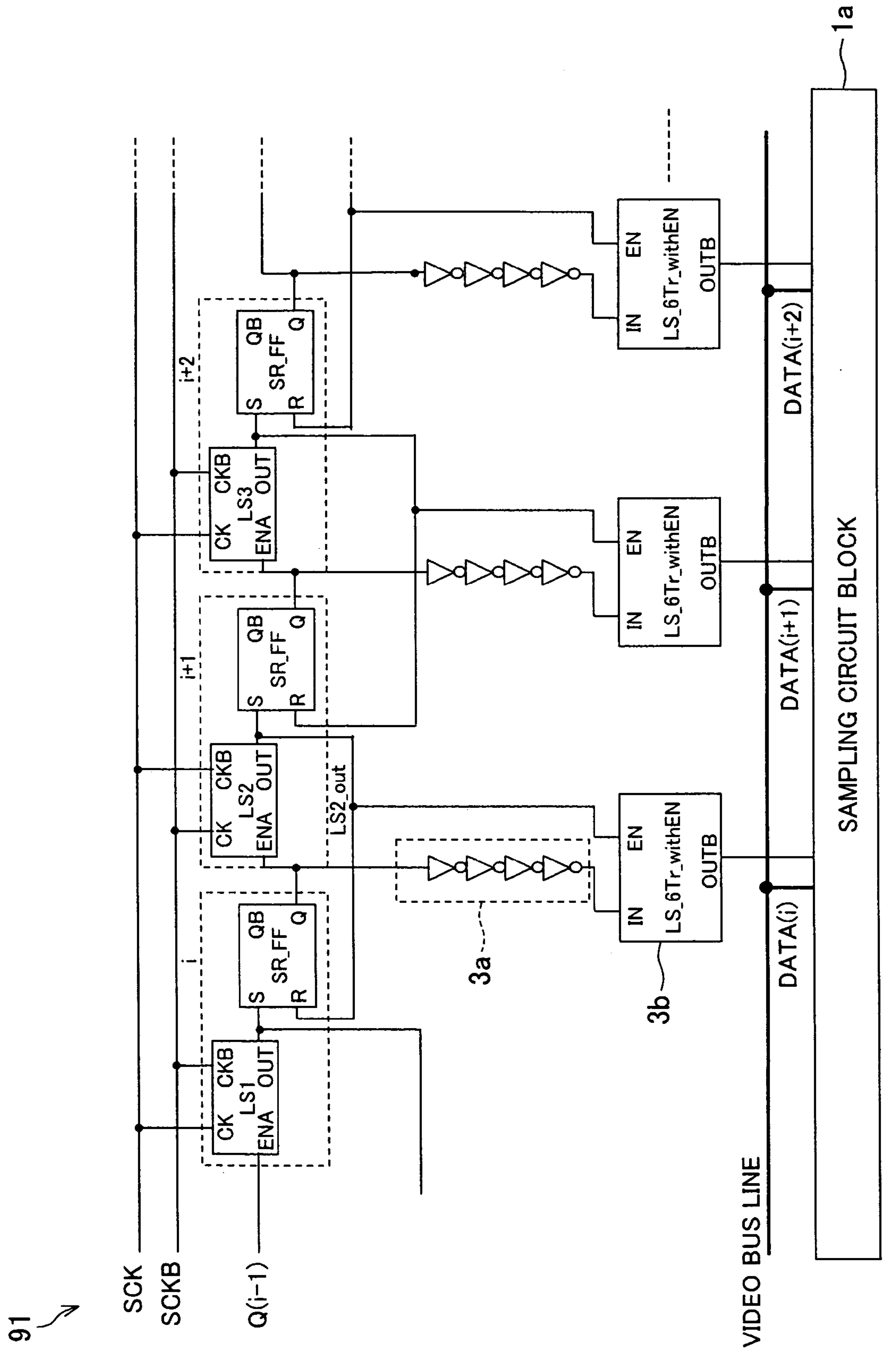
FIG. 13 is a circuit block diagram illustrating a structure of a source driver according to Fourth Embodiment of the present invention.
Figure 14:
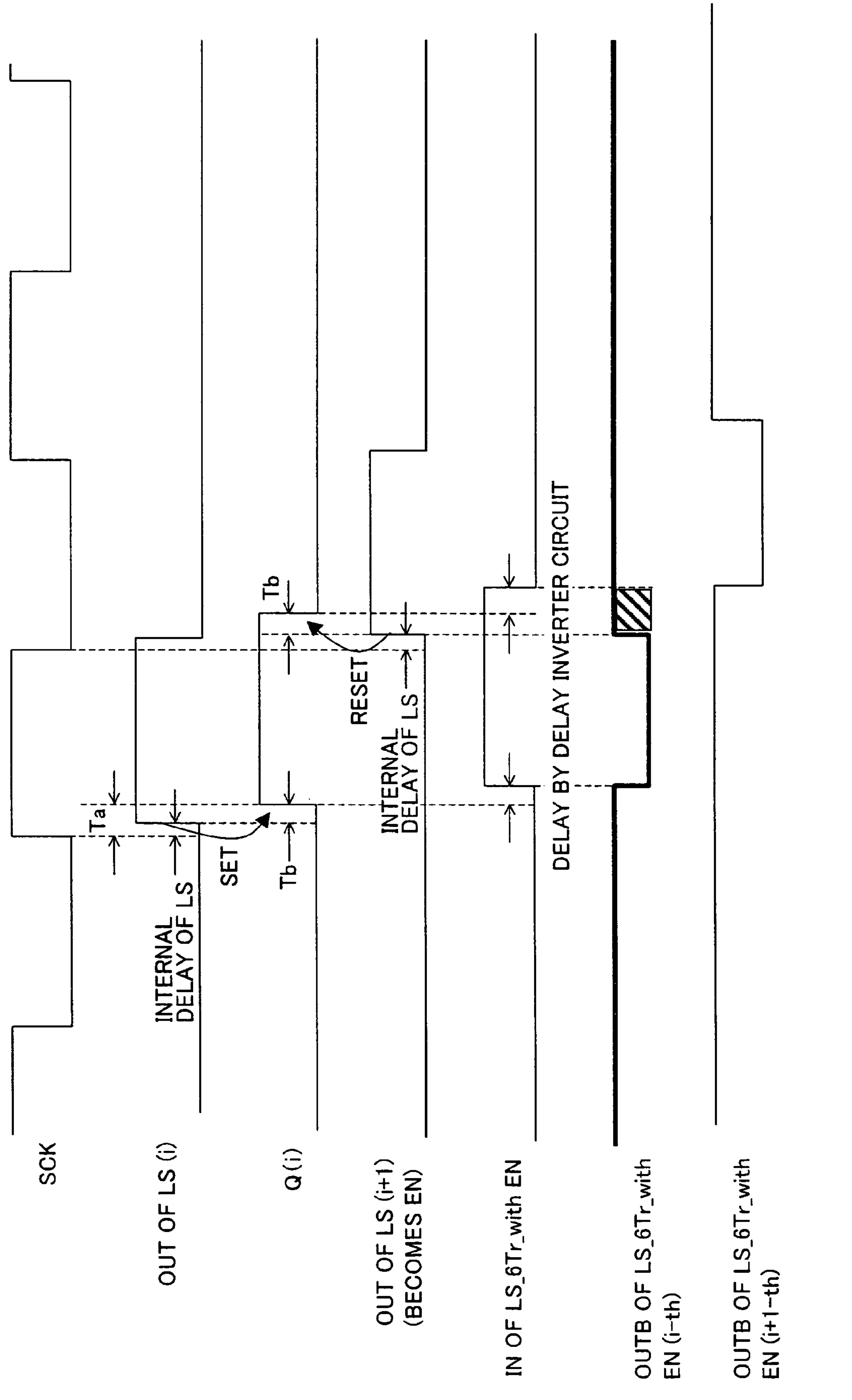
FIG. 14 is a timing chart showing operation of the source driver of FIG. 13.

The following explains yet another embodiment of the present invention with reference to FIGS. 13 and 14. For ease of explanation, materials having the equivalent functions as those shown in the description of First Embodiment through Third Embodiment above will be given the same reference symbols, and explanation thereof will be omitted here.

FIG. 13 shows a source driver 91 provided in a liquid crystal display device (the display device of the present embodiment), and the peripheral structure thereof. Apart from them, the liquid crystal display device further includes the display panel 1 and the gate driver 2 identical to those in First Embodiment.

This source driver 91 has the similar structure as that of the source driver 3 shown in FIG. 1. Here, the output terminal OUT of the level shifter LS is connected to the set input terminal S of the flip flop FF, and the reset input terminal R of the flip flop FF and the enable terminal EN of the level shifter 3*b* are connected to the output terminal of the next-stage level shifter LS. The structures of the level shifter LS and the flip flop FF of FIG. 13 are basically the same as those of FIG. 1. In FIG. 13, the output terminal OUT of the level shifter LS is connected to not the inversion set input terminal SB but the set input terminal S of the flip flop FF. However, when the output signal from the output terminal OUT of the level shifter LS passes through an inverter, it becomes identical to the output from the output terminal OUTB of FIG. 1.

With reference to FIG. 14, the following explains sampling pulse production operation by the source driver 91 with the foregoing structure.

In FIG. 14, instead of the waveform of the output pulse of the corresponding flip-flop FF denoted by the waveform of the output signal Q (i+1) in FIG. 4, the output pulse of the next stage level shifter LS is shown as the waveform OUT of the level shifter LS (i+1). In this case, the rise of the output pulse of the corresponding flip-flop FF denoted by the waveform of the output signal Q (i) is delayed by the internal delay time Tb of the flip flop FF from the rise of the output pulse of the corresponding level shifter LS denoted by the waveform OUT of LS (i). The output pulse of the corresponding flip flop FF corresponds to the first pulse. Further, the rise of the output pulse of the next stage level shifter LS is ahead of the fall of the output pulse of the corresponding flip flop FF by the internal delay time Tb of the flip flop FF.

As a result, the level shifter 3*b* produces a pulse that falls at the same timing as that of the output pulse of the corresponding flip flop FF delayed by the delay inverter circuit 3*a*, and rises at a rising timing (beginning end) of the output pulse (reference pulse) of the next stage level shifter LS. This pulse is outputted from the level shifter 3*b* as the sampling pulse (second pulse). As denoted by the diagonal lines in the figure, this sampling pulse is equal to a pulse obtained by removing an terminal portion from the signal supplied to the input terminal IN, which terminal portion corresponds to the difference between the terminal end of the signal and the rising point of the output pulse of the next stage level shifter LS. Further, the terminal end of the sampling pulse is ahead of from the rise of the output pulse of the next stage level shifter LS by a period corresponding to the delay of the fall of the output pulse of the corresponding flip flop FF.

Further, in this case, since the rise of the output pulse of the next stage flip flop is identical in timing to the fall of the output pulse of the corresponding flip flop FF, there is a distance as shown in the bottom of FIG. 4 between the sampling pulse outputted from the level shifter 3*a* and the sampling pulse of the immediately-preceding stage.

As described, in the present embodiment, the i-th sampling pulse is produced through modification of the waveform of the output pulse Q (i) (first pulse) in such a manner that the output pulse Q (i) (first pulse) is delayed first, and this delayed output pulse Q (i) is used until the beginning end of the output pulse of the level shifter LS, that is a reference pulse of the i-th sampling pulse; further, after the beginning end, an inversion signal of the pulse level of the delayed output pulse Q (i) is supplied.

In this way, by using the delayed output pulse Q (i) and supplying the inversion level not related to the delay of the output pulse Q (i), the sampling pulses not overlapped with each other may be created.

Generally, the signal having been through the level shifter LS has a great blunt in waveform, and therefore an inverter is provided before the output of the level shifter LS to shape the blunt. However, when the load of the circuits provided in the output side of the level shifter LS is small, the inverter is not required, or only a small inverter is used. In this view, the structure of the present embodiment in which the sampling pulse is produced from the output of the level shifter as such is advantageous. Meanwhile, when the load of the circuits at the output side of the level shifter LS is great, in the present embodiment, the inverter is provided to a portion where the output of the level shifter LS is supplied to the reset input terminal R of the flip flop FF and the enable terminal EN of the level shifter 3*b*. Therefore, in such a case, the structure of First Embodiment is more preferable as it is arranged so that the output of the level shifter LS is supplied to the flip flop FF, and the resulting signal is used as the reset signal of the flip flop FF or is supplied to the enable terminal EN. In either structure, the internal delay of the flip flop FF is cancelled by using the input signal supplied to the reset input terminal R of the flip flop FF as the reference pulse of the sampling pulse.

Fifth Embodiment

Figure 15:
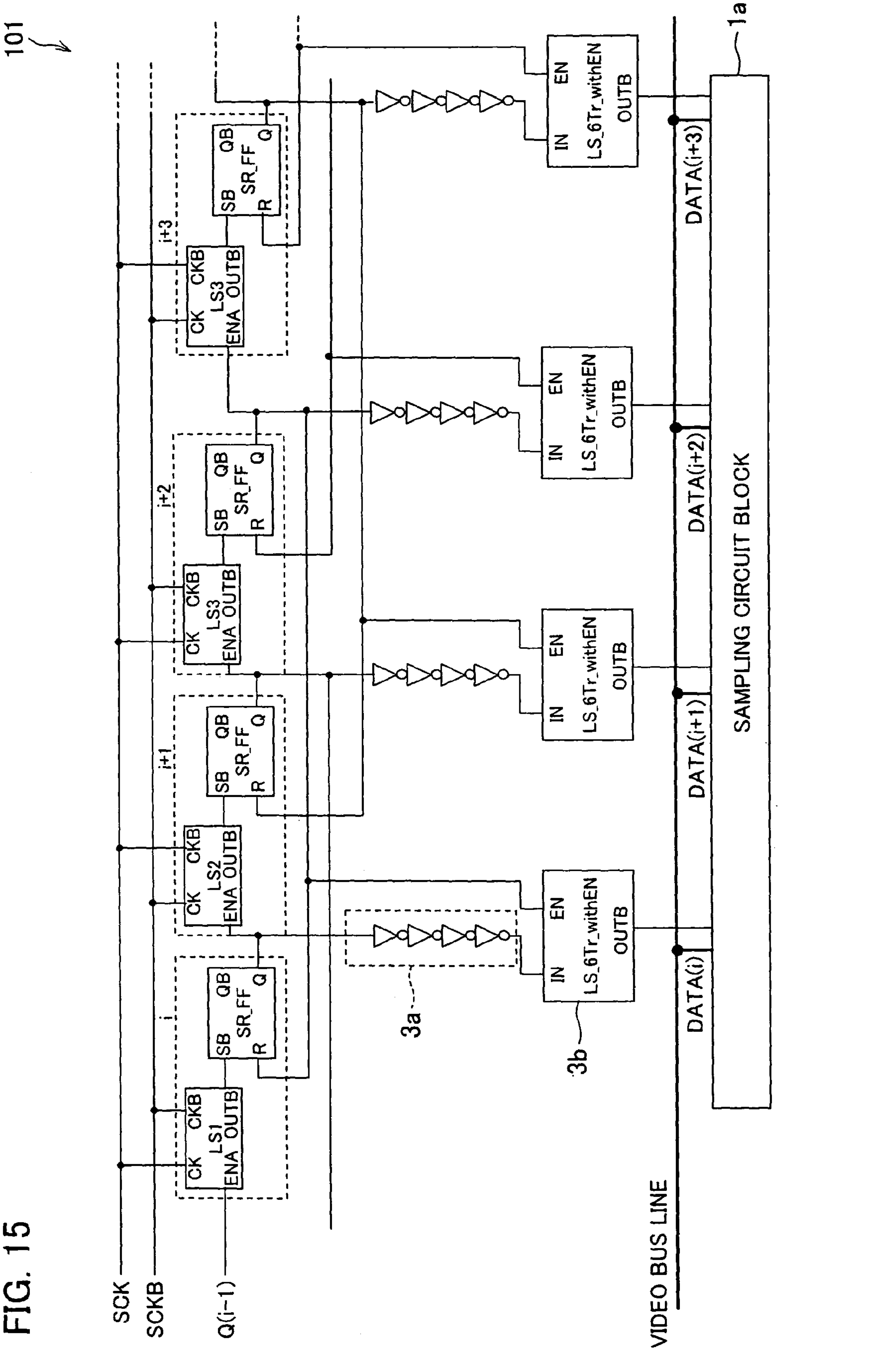
FIG. 15 is a circuit block diagram illustrating a structure of a source driver according to Fifth Embodiment of the present invention.
Figure 16:
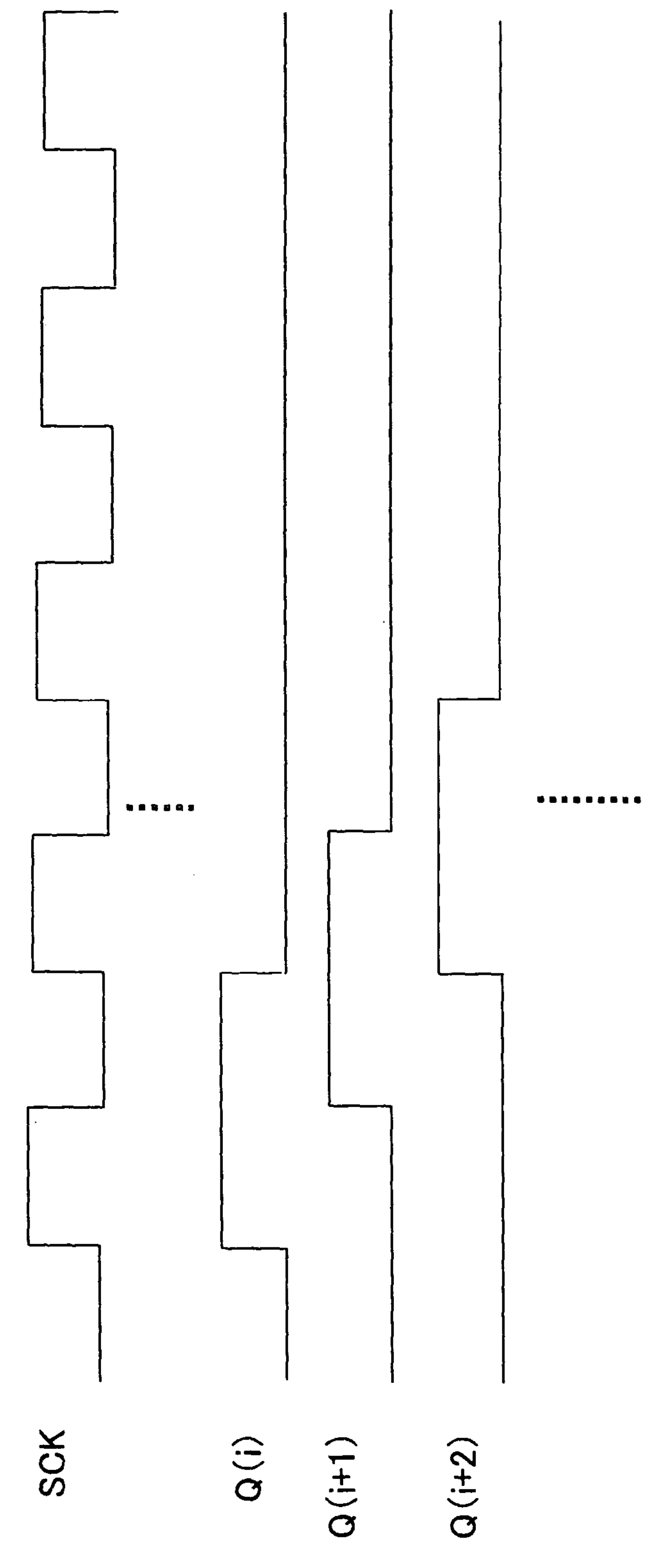
FIG. 16 is a timing chart showing output signals of flip flops of a source driver of FIG. 15.
Figure 17:
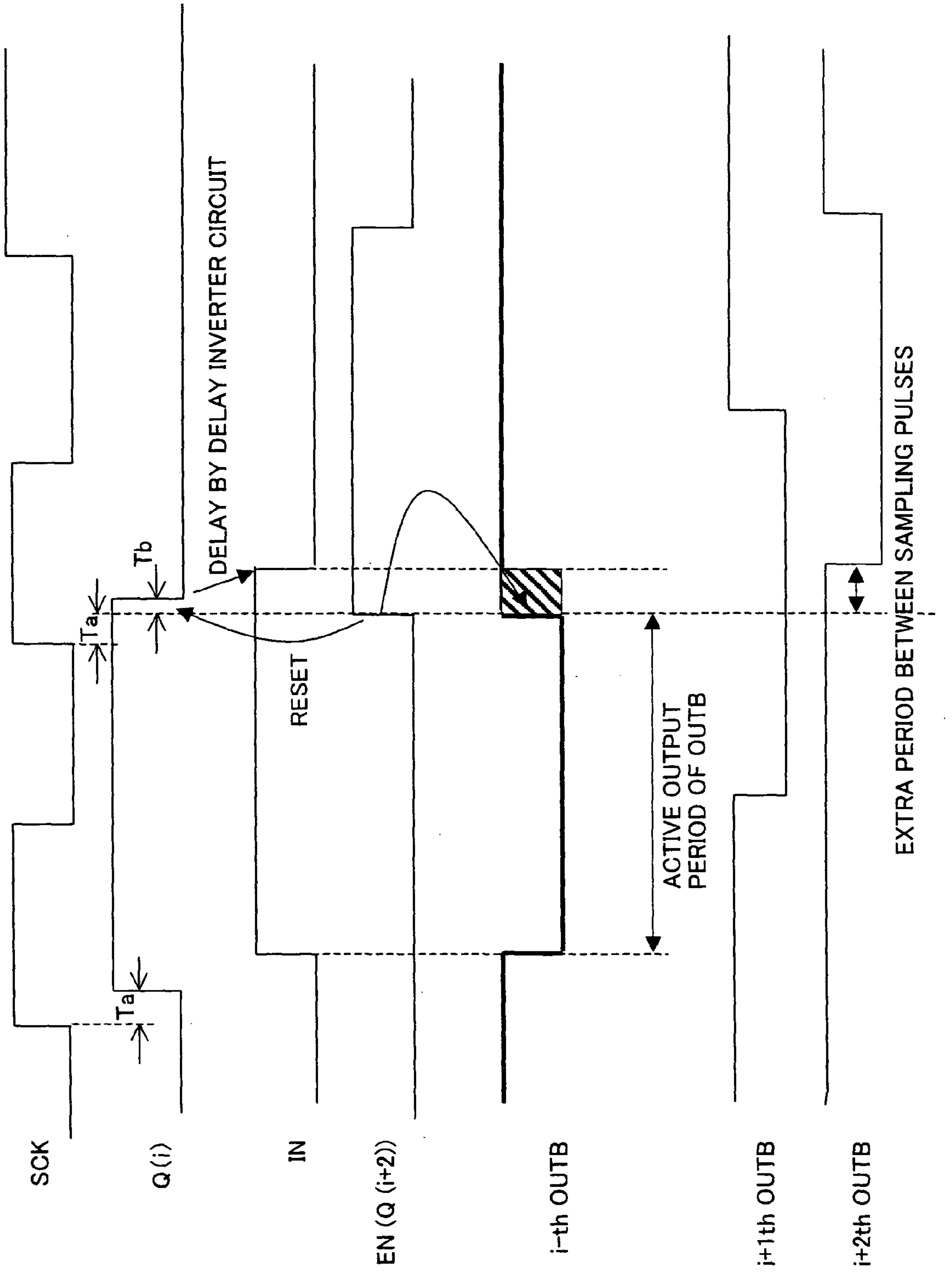
FIG. 17 is a timing chart showing operation of the source driver of FIG. 16.

The following explains still another embodiment of the present invention with reference to FIGS. 15 through 17. For ease of explanation, materials having the equivalent functions as those shown in the description of First Embodiment through Fourth Embodiment above will be given the same reference symbols, and explanation thereof will be omitted here.

FIG. 15 shows a source driver 101 provided in a liquid crystal display device (the display device of the present embodiment), and the peripheral structure thereof. Apart from them, the liquid crystal display device further includes the display panel 1 and the gate driver 2 identical to those in First Embodiment.

The source driver 101 shown in FIG. 15 has the similar structure as that of the source driver 3 shown in FIG. 1; however, here, the reset terminal R of the flip flop FF and the enable terminal EN of the level shifter 3*b* are connected to the output terminal of the flip flop FF of the stage after next.

With reference to FIG. 16, the following explains the manner of writing of the video signal DATA to the source bus line SL in the foregoing structure. After writing of the video signal DATA (i) to the source bus line SL (i), the video signal DATA (i) is also supplied to the video signal transmission line so as to carry out pre-charging of the source bus line SL (i+1) and in some cases also to the pixel thereof. Next, the video signal DATA (i+1) is supplied to the video signal transmission line to be written to the source bus line SL (i+2) and to the pixel, and also for pre-charging of the source bus line SL (i+2) and in some cases of the pixel too.

In this manner, pre-charging and data writing are sequentially performed with a sampling pulse overlapped with the adjacent pulse. Such a sampling pulse is called a double pulse. FIG. 16 shows double pulses of the output signals Q (i), Q (i+1) and Q (i+2) that are outputted from the flip flop FF.

With reference to FIG. 17, the following explains operation of the source driver 101 with the foregoing structure using double pulses.

FIG. 17 shows a structure in which the output pulse of the corresponding flip flop FF denoted by the signal waveform of the output signal Q (i) in FIG. 4 is kept at a high level until the output pulse of the flip flop FF of the stage after next is supplied. After a time corresponding to the internal delay time Tb of the flip flop FF elapsed after the rising of the output pulse of the flip flop FF of the stage after next, that is denoted by the waveform of the output signal Q (i+2), the output pulse (first pulse) of the corresponding flip flop, that is denoted by the signal waveform of the output signal Q (i), falls. Meanwhile, the rise of the output pulse of the corresponding flip flop FF is delayed by the delay inverter circuit 3*a* before being supplied to the input terminal IN of the level shifter 3*b*.

As a result, the level shifter 3*b* produces a pulse that falls at the same timing as that of the output pulse of the corresponding flip flop FF delayed by the delay inverter circuit 3*a*, and rises at a rising timing (beginning end) of the output pulse (reference pulse) of the flip flop FF of the stage after next. This pulse is outputted from the output terminal OUTB as the sampling pulse (second pulse). As denoted by the diagonal lines in the figure, the delay of the sampling pulse is shortened by a period corresponding the delay of the terminal end of the input signal supplied to the input terminal IN from the rise of the output pulse of the flip flop FF of the stage after next. Further, the terminal end of the sampling pulse is put forward by a period corresponding to the delay of the fall of the output pulse of the corresponding flip flop FF from the rise of the output pulse of the flip flop FF of the stage after next.

Similarly, the pulses are sequentially outputted in such a manner that a sampling pulse overlapped with the sampling pulse of the preceding stage (e.g. i) is outputted from the (e.g. i+1) level shifter 3*b*, and a sampling pulse overlapped with the sampling pulse of the preceding stage (e.g. i+1) is outputted from the (e.g. i+2) level shifter 3*b*. Here, the sampling pulse of the stage after next falls at the same timing of the rise of the output pulse of the flip flop FF of the stage after next that had been delayed by the delay inverter circuit 3*a*. Accordingly, the sampling pulse of the stage after next is not overlapped with the sampling pulse of the corresponding stage, thus giving a sufficient interval therebetween. Therefore, it is possible to open the sampling switch ASW of the corresponding stage sufficiently before the supply of the video signal DATA for pre-charging of the source bus line SL and the pixel of the stage after next, and after the video signal DATA is written to the source bus line SL and the pixel of the corresponding stage. Further, it is also possible to close the sampling switch ASW of the stage after next sufficiently after the start of the supply of the video signal DATA of the next stage for pre-charging of the source bus line SL and the pixel of the stage after next.

In addition to the described structure of the present embodiment, the output pulse of the third stage on flip flop FF may be supplied to the reset terminal R and the enable terminal EN of the level shifter 3*b* to modify the structure to use a triple pulse. Similarly, the pair of i-th group and the i+1th group in the other embodiment may be replaced with a pair of the i-th (i is a natural number) and a i+k-th group (k is a predetermined natural number).

Sixth Embodiment

Figure 18:
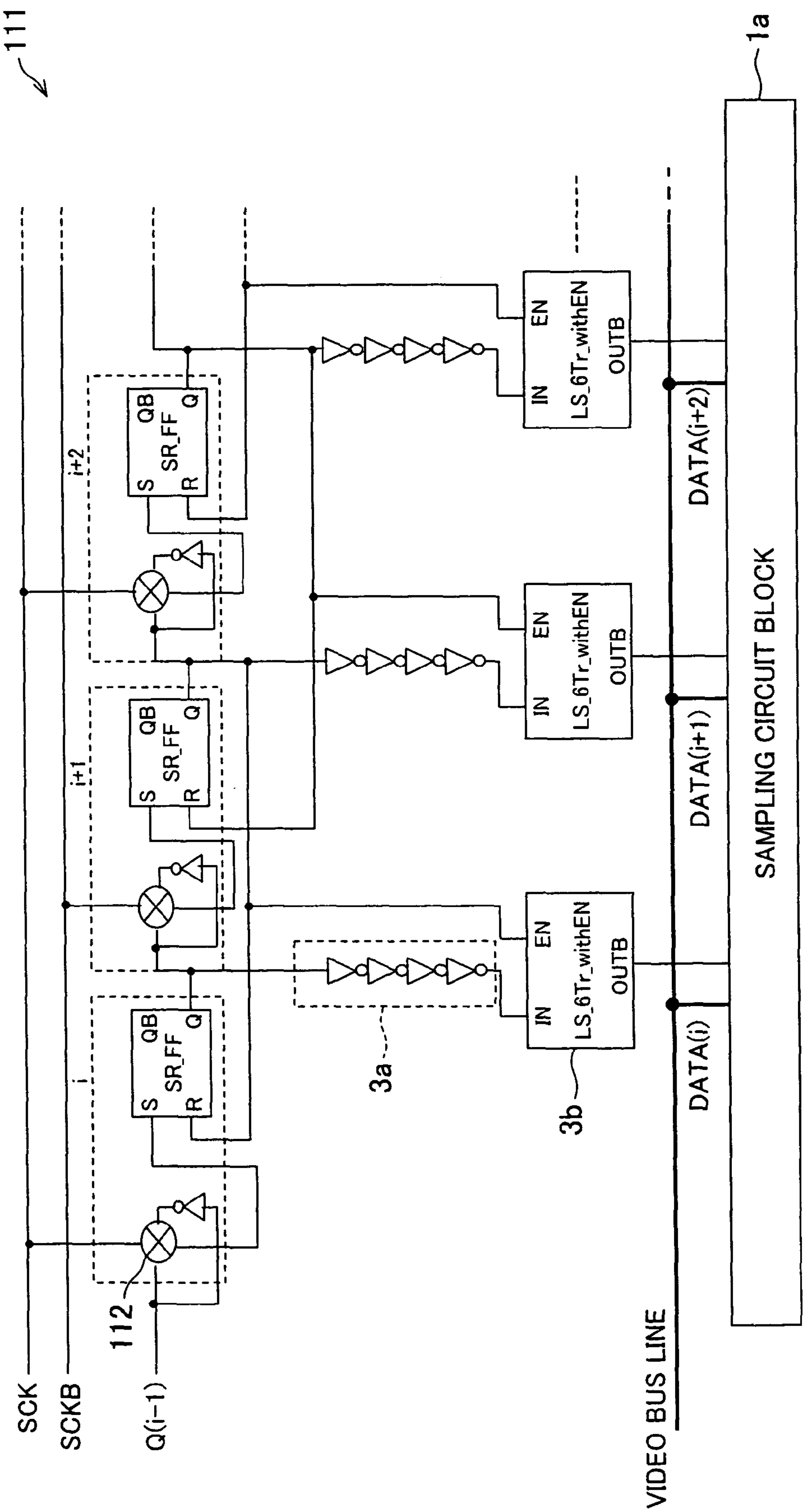
FIG. 18 is a circuit block diagram illustrating a structure of a source driver according to Sixth Embodiment of the present invention.
Figure 19:
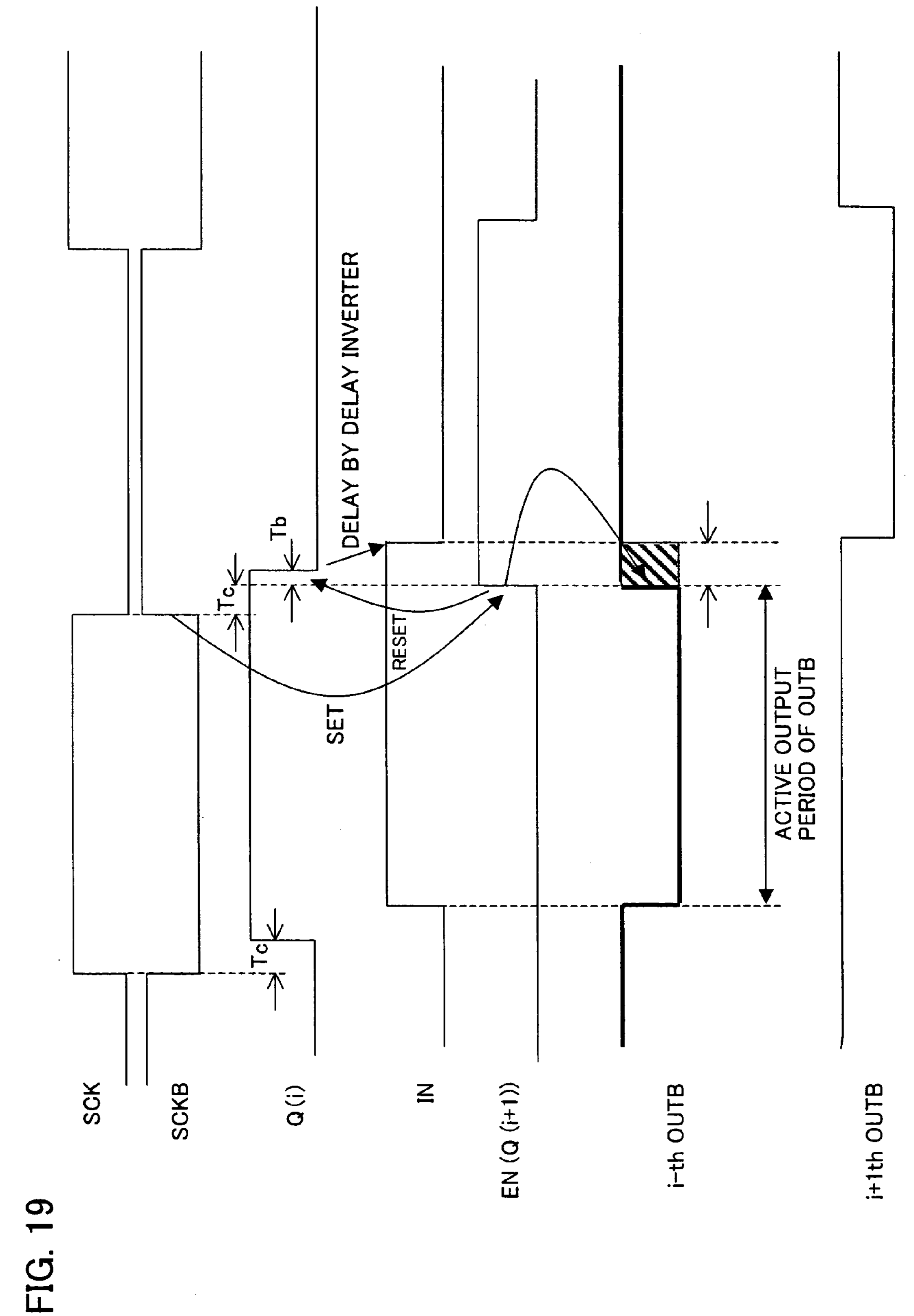
FIG. 19 is a timing chart showing operation of the source driver of FIG. 18.

The following explains yet another embodiment of the present invention with reference to FIGS. 18 and 19. For ease of explanation, materials having the equivalent functions as those shown in the description of First Embodiment through Fifth Embodiment above will be given the same reference symbols, and explanation thereof will be omitted here.

FIG. 18 shows a source driver 111 provided in a liquid crystal display device (the display device of the present embodiment), and the peripheral structure thereof. Apart from them, the liquid crystal display device further includes the display panel 1 and the gate driver 2 identical to those in First Embodiment.

The source driver 111 includes analog switches 112 instead of the level shifters LS of the source driver 3 of FIG. 1. In the analog switch 112 of each group, the output signal of the immediately preceding stage flip flop FF is supplied as such to the gate of the n-type TFT, and also to the gate of the p-type TFT via an inverter. The analog switch 112 is supplied with either the clock signal SCK or the clock signal SCKB depending on whether it is at an odd-numbered stage or at an even-numbered stage. In the example shown in the figure, the i-th group analog switch 112 is supplied with the clock signal SCK, and the other terminal of each analog switch is connected to the set input terminal S of the corresponding flip flop FF. Note that, the clock signal SCK or SCKB may be supplied to the inversion set input terminal SB of the corresponding flip flop FF via an inverter, as with the structure of FIG. 1.

This structure is advantageous when the supplied clock signal SCK or SCKB is at a level to drive the logic circuit of the flip flop FF.

With reference to FIG. 19, the following explains operation of the source driver 111 with the foregoing structure.

As denoted by the signal waveforms of the output signals Q (i) and Q (i+1), the rise of the output pulse of the flip flop FF is delayed by a delay time Tc from the rise of the clock signal SCK or SCKB. The delay time Tc is sum of the internal delay time of the analog switch 112 and the internal delay time of the flip-flop FF. This output pulse is delayed by the delay inverter circuit 3*a* before supplied to the input terminal IN of the level shifter 3*b*.

As a result, as with the structure of FIG. 4, the level shifter 3*b* produces a pulse that falls at the same timing as that of the output pulse of the corresponding flip flop FF delayed by the delay inverter circuit 3*a*, and rises at a rising timing (beginning end) of the output pulse (reference pulse) of the next stage flip flop FF. This pulse is outputted from the output terminal OUTB as the sampling pulse (second pulse). As denoted by the diagonal lines in the figure, this sampling pulse is equal to a pulse obtained by removing an terminal portion from the signal supplied to the input terminal IN, which terminal portion corresponds to the difference between the terminal end of the signal and the rising point of the output pulse of the next stage level shifter LS. Further, the terminal end of the sampling pulse is put forward by a period corresponding to the delay of the fall of the output pulse of the corresponding flip flop FF from the rise of the output pulse of the next stage flip flop FF. As with the example of FIG. 14, the adjacent sampling pulses are not overlapped in this structure.

Further, in the present embodiment, the reset terminal of the flip flop FF and the enable terminal EN of the level shifter 3*b* are connected to the output terminal Q of the next stage flip flop FF; however, these terminals may be connected to the other terminal (the terminal on the side of the flip flop FF) of the next stage analog switch 112 according to the source driver 91 of FIG. 13.

Seventh Embodiment

Figure 20:
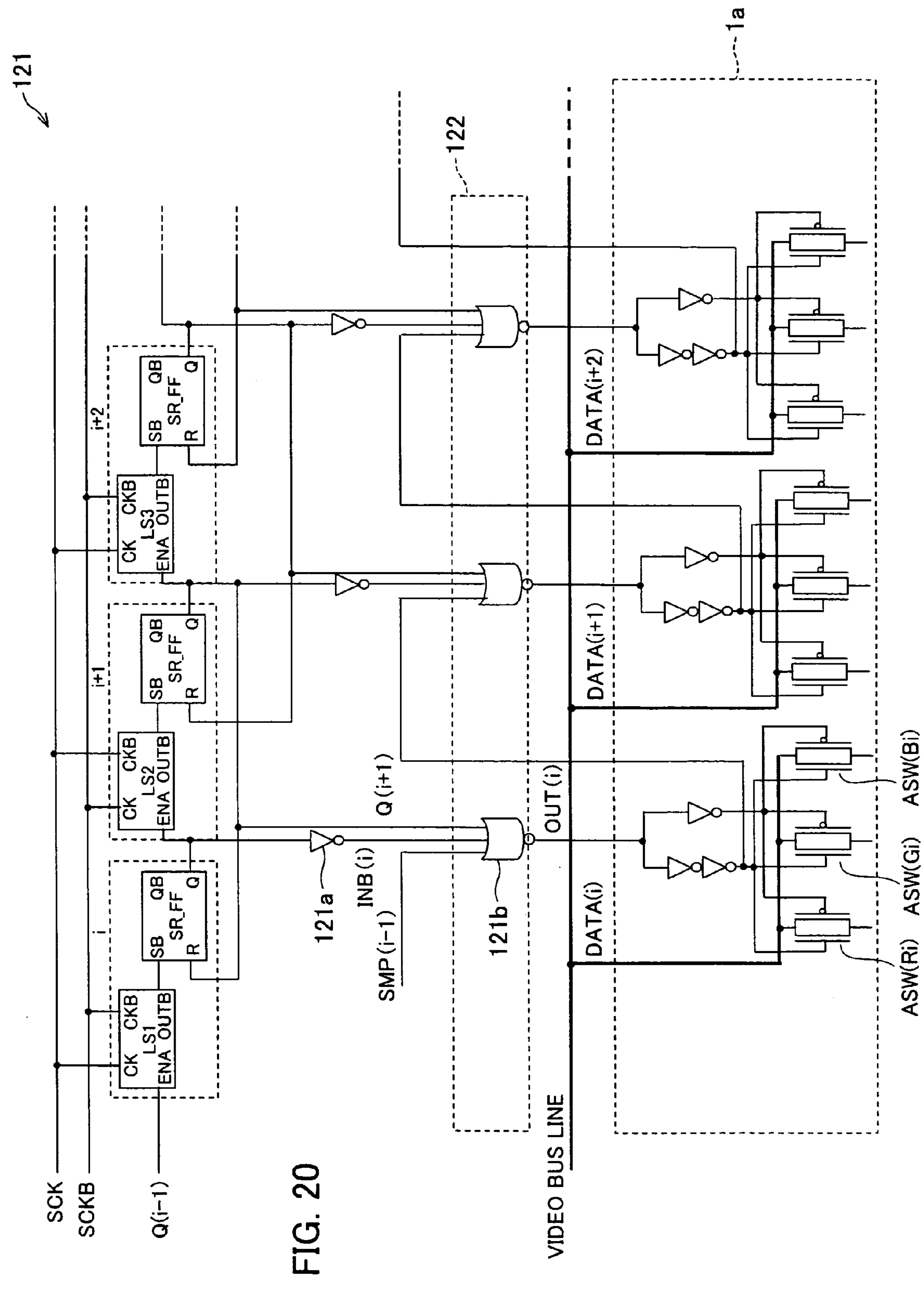
FIG. 20 is a circuit block diagram illustrating a structure of a source driver according to Seventh Embodiment of the present invention.
Figure 21:
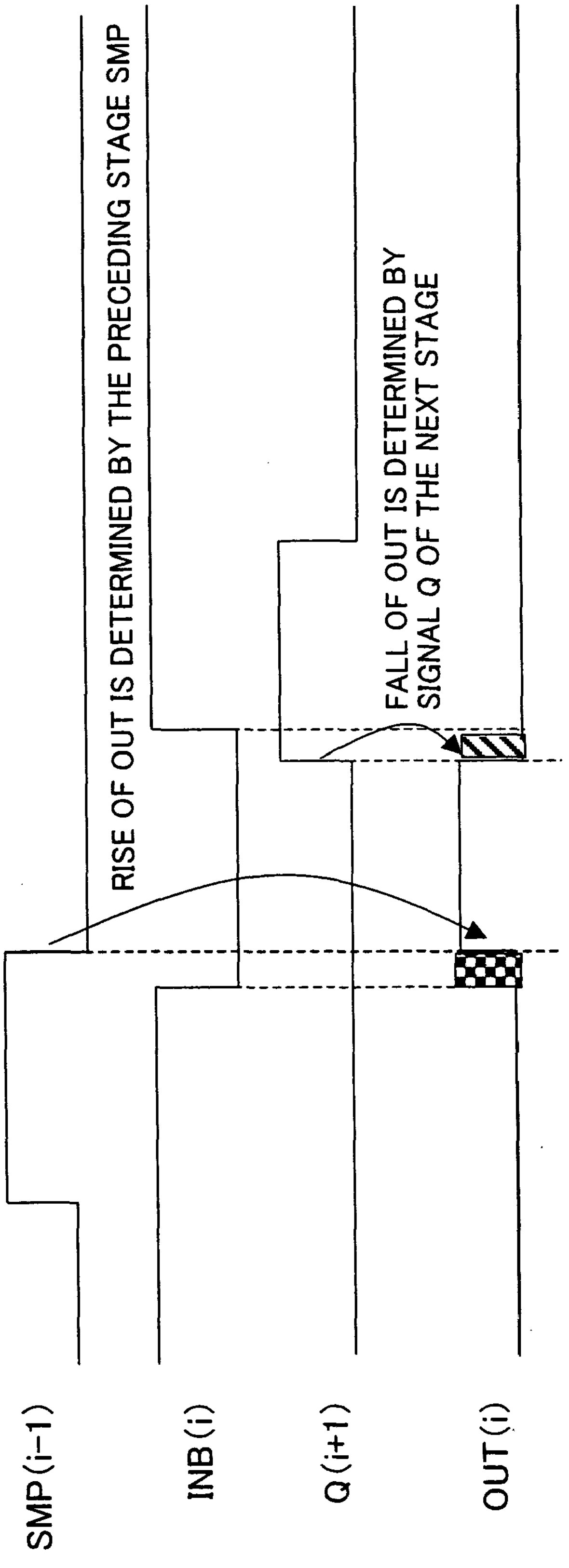
FIG. 21 is a timing chart showing operation of the source driver of FIG. 20.
Figure 22:
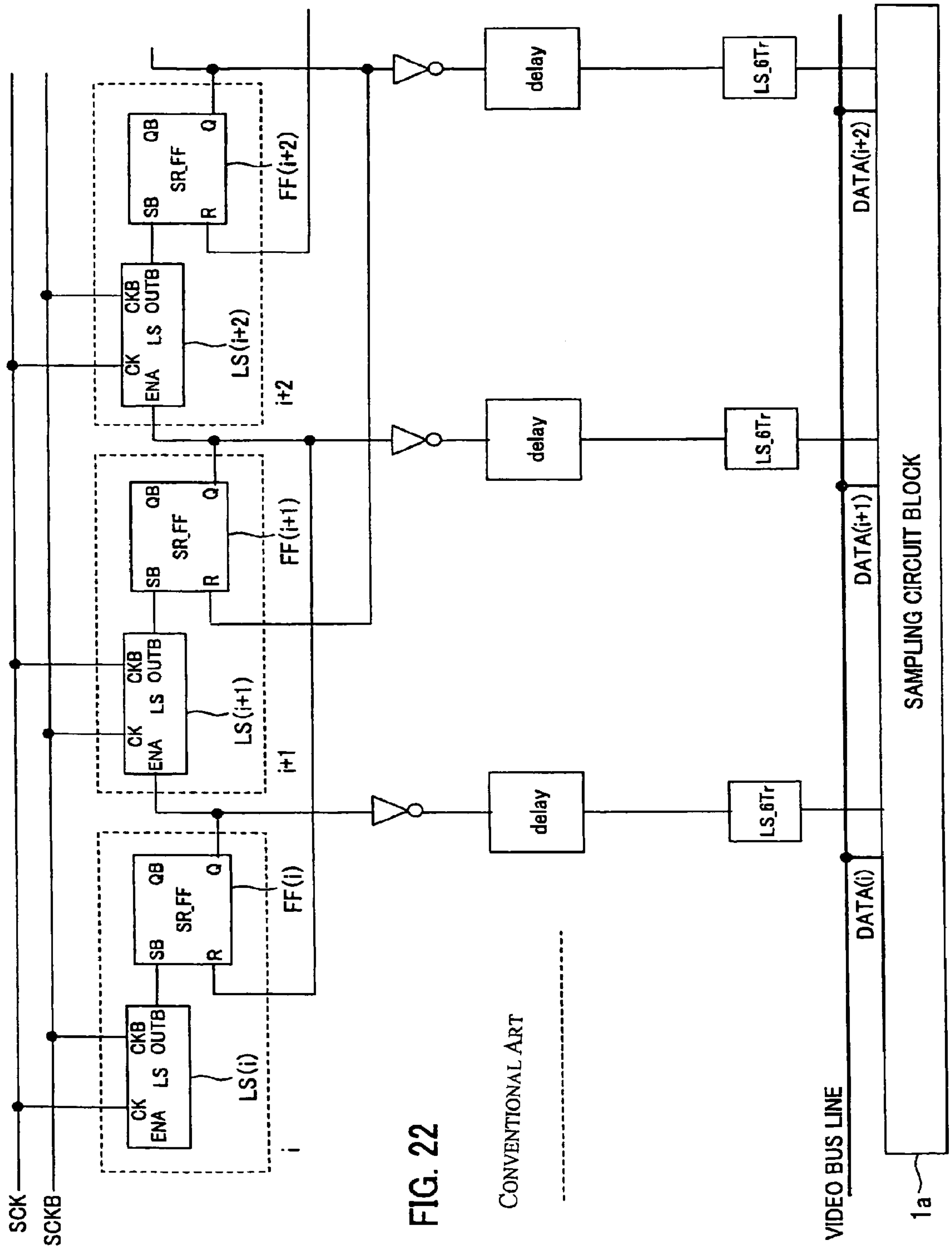
FIG. 22 CONVENTIONAL ART
FIG. 22 is a circuit block diagram showing a structure of a conventional source driver.
Figure 23:
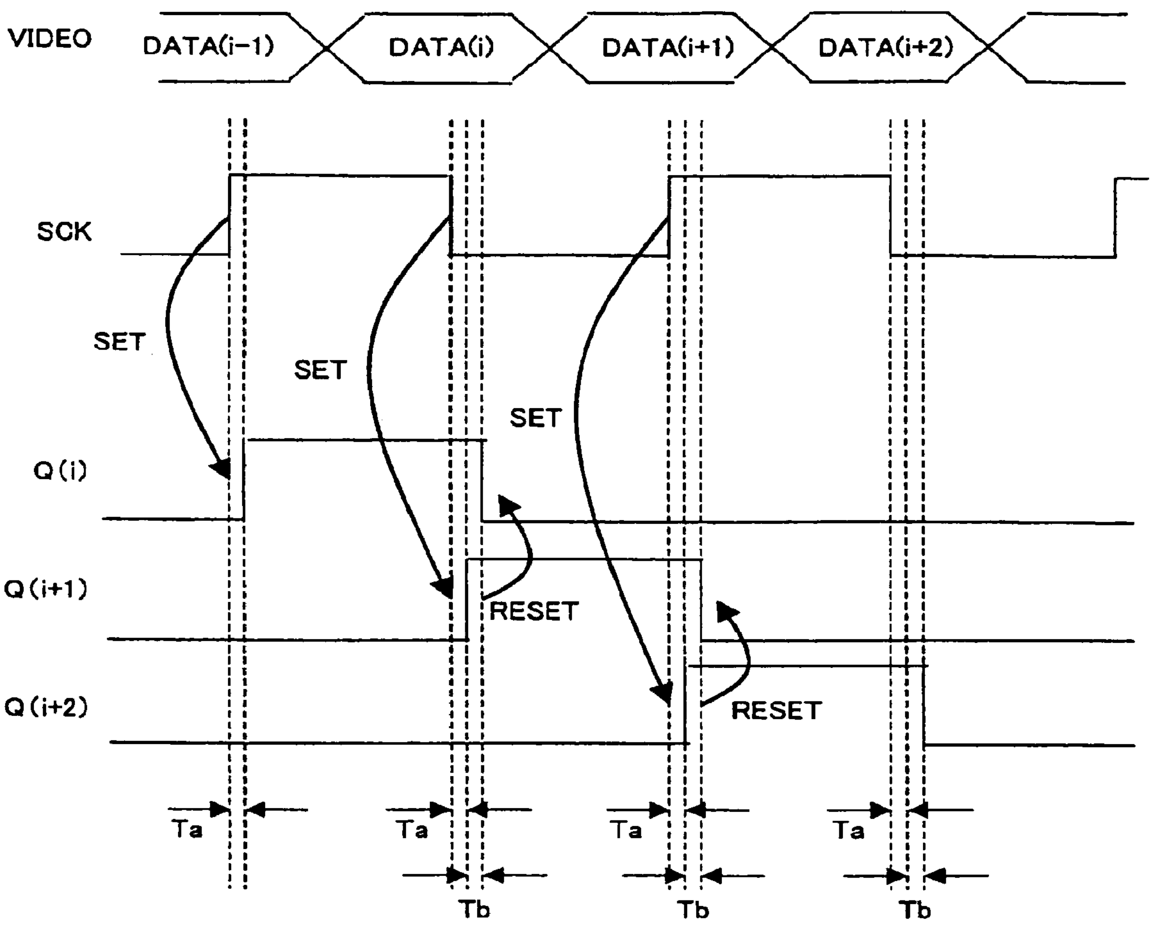
FIG. 23 is a timing chart showing output signals of flip-flops of the source driver of FIG. 22.
Figure 24:
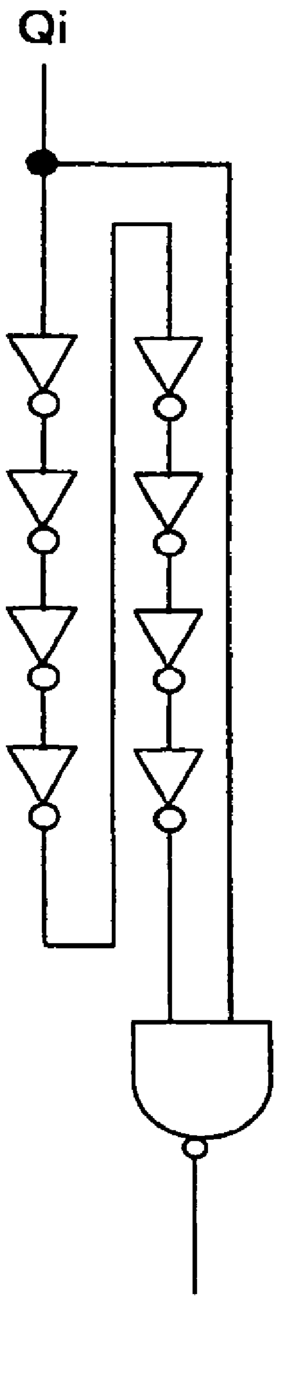
FIG. 24 CONVENTIONAL ART
FIG. 24 is a circuit block showing a structure of a delay circuit provided in the source driver of FIG. 22
Figure 25:
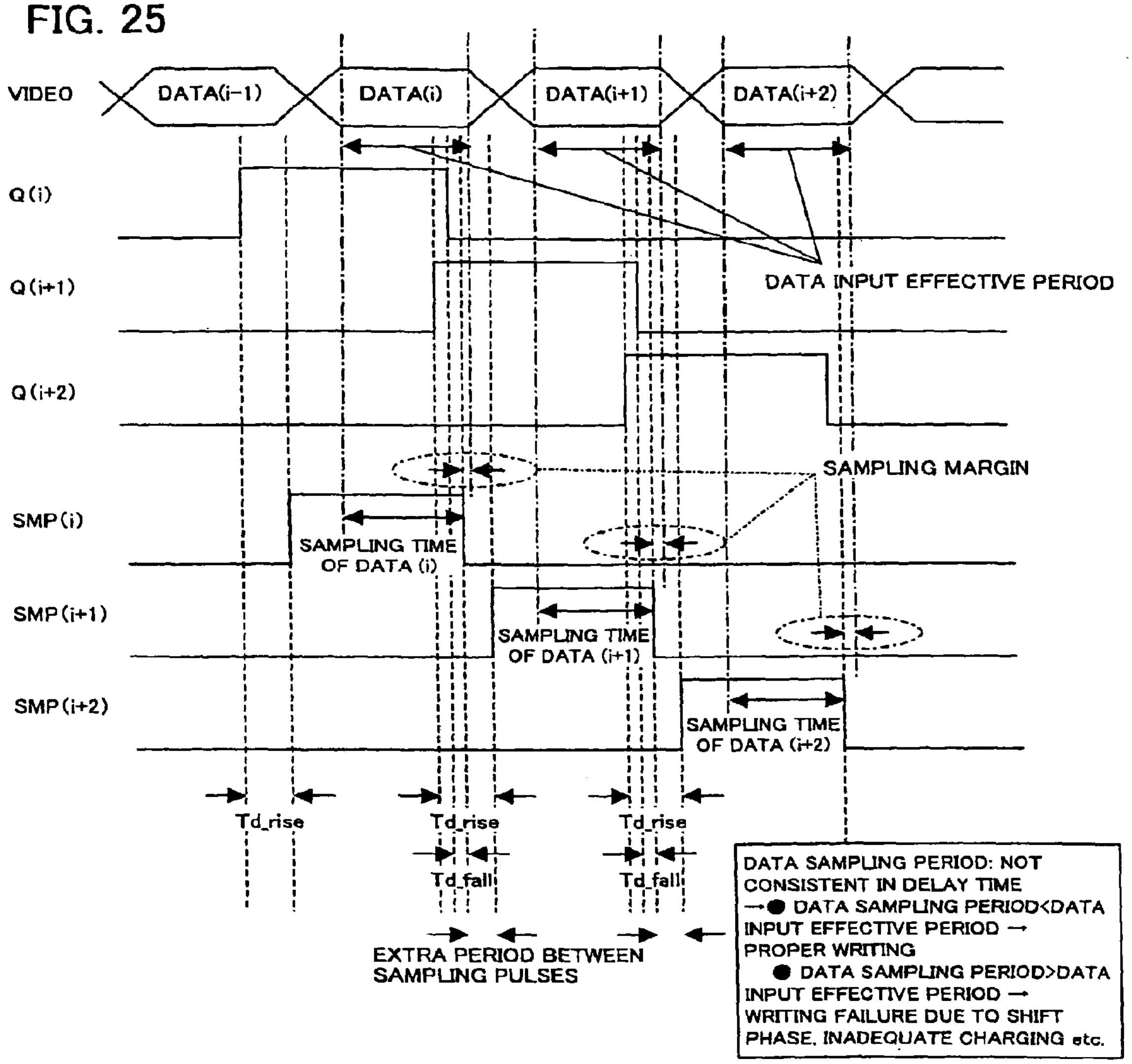
FIG. 25 is a timing chart showing operation of the source driver of FIG. 22.

The following explains yet another embodiment of the present invention with reference to FIGS. 20 and 21. For ease of explanation, materials having the equivalent functions as those shown in the description of First Embodiment through Sixth Embodiment above will be given the same reference symbols, and explanation thereof will be omitted here.

FIG. 20 shows a source driver 121 provided in a liquid crystal display device (the display device of the present embodiment), and the peripheral structure thereof. Apart from them, the liquid crystal display device further includes the display panel 1 and the gate driver 2 identical to those in First Embodiment.

The source driver 121 includes inverters 121*a* and three-input NORs 121*b* instead of the delay inverter circuits 3*a* and the level shifters 3*b* of the source driver 3 of FIG. 1. The NORs 121*b* constitute a logic section 122. In the inverter 121*a* of each group, the input terminal is connected to the output terminal Q of the corresponding flip flop FF, and the output terminal is connected to a first input terminal, one of the input terminals of the NOR 121*b*. Further, another input terminal, the second input terminal of the NOR 121*b* is connected to the output terminal Q of the next stage flip flop FF, and the remaining input terminal, the third input terminal of the NOR 121*b* is connected to the output terminal of the NOR 121*b* of the immediately preceding stage via a circuit made of a two-stage cascade connection inverters. Note that, the NOR 121*b* generally has an input terminal connected to the output terminal Q of the corresponding flip flop FF, and the polarity inversion here by the inverter is performed only for ease of explanation. However, as described later, the signal delay that occurs between the output terminal Q and the NOR 121*b* is smaller than the delay due to the circuit made of a two-stage cascade connection inverters.

The circuit made of a two-stage cascade connection inverters is provided in the sampling circuit block 1*a* as a control signal processing circuit for processing the signal supplied from the output terminal of the NOR 121*b* to the gate of the n-type TFT of the analog switch ASW. Further, the sampling circuit block 1*a* includes one-stage inverter as a control signal processing circuit for processing the signal supplied from the output terminal of the NOR 121*b* to the gate of the p-type TFT of the analog switch ASW.

With reference to FIG. 21, the following explains operation of the source driver circuit 121 with the foregoing structure.

First, the output pulse (first pulse) of the corresponding flip flop FF is slightly delayed by the inverter 121*a* so that it falls like the signal waveform shown in the signal INB (i) in FIG. 21. Further, since the output pulse of the next stage flip flop FF rises before the fall of the output pulse of the corresponding flip flop FF, the output pulse of the next stage flip flop rises before the rise of the signal INB (i), as shown in the signal waveform of the output signal Q (i+1). Accordingly, as denoted by the signal waveform of the signal SMP (i−1), the delayed sampling pulse SMP, that is the sapling pulse of the immediately preceding stage having been delayed by the circuit made of a two-stage cascade connection inverters, is kept at a low level until this point, the output of the NOR 121*b* is inverted at the rise of the output pulse of the next-stage flip flop FF, thus creating the terminal end of the sampling pulse.

Then, the sampling pulse becomes the delayed sampling pulse SMP that is delayed by the inverter of a two-stage cascade connection circuit, and is supplied to the next stage NOR 121*b* and falls after the fall of the signal INBi that is the output pulse of the flip flop FF having been delayed by the one-stage inverter. Accordingly, the output of the NOR 12*b* is inverted at a fall of the delayed sampling pulse 121*b* of the immediately preceding stage, thus creating the beginning end of the sampling pulse.

As a result, as denoted by the signal waveform of the signal OUTi of FIG. 21, the NOR 121*b* produces a pulse that rises at the same timing as the fall of the sampling pulse of immediately preceding stage delayed by the circuit made of a two-stage cascade connection inverters, and falls at a rising timing (beginning end) of the output pulse (reference pulse) of the next stage flip flop FF. This pulse is outputted from the output terminal as the sampling pulse (second pulse). As denoted by the diagonal lines in the figure, the terminal end of the sampling pulse is earlier than the delayed output of the corresponding FF by a period corresponding to the delay of the terminal end of the output pulse of the corresponding flip flop FF, whose rising timing is delayed by the inverter 121*a*, from the rise of the output pulse of the next stage flip flop FF. Further, the terminal end of the sampling pulse is put forward by a period corresponding to the delay of the fall of the output pulse of the corresponding flip flop FF from the rise of the output pulse of the next stage flip flop FF.

Further, as denoted by the mesh pattern in the figure, the beginning end of the sampling pulse is behind of the rise of the output pulse of the corresponding flip flop FF having been delayed by the inverter 121*a* by an amount corresponding to the delay of the fall of the output pulse of the immediately preceding stage by the circuit made of a two-stage cascade connection inverters.

As described, with such an arrangement, the foregoing method of the present embodiment produce the i+1th sampling pulse through modification of the waveform of the output signal Q (i+1), that is the first pulse, using either a logic calculation of the delayed i-th sampling pulse and the output pulse Q (i+1), i.e., the reference pulse of the i-th sampling pulse, and the output pulse (i+2), i.e., a reference pulse of the i+1-th sampling pulse, or a logic calculation of the delayed i-th sampling pulse, the output pulse Q (i+1) delayed by a smaller value than that for delaying the i-th sampling pulse, and the output pulse Q (i+2). The logic calculation may be based on OR, or AND logic; otherwise, a logic element such as an analog switch may be used.

With this method, it is possible to easily produce the second pulse not overlapped with each other only by using pulse logic.

Eighth Embodiment

The following explains still another embodiment of the present invention with reference to FIGS. 26 through 29. For ease of explanation, materials having the equivalent functions as those shown in the description of First Embodiment through Seventh Embodiment above will be given the same reference symbols, and explanation thereof will be omitted here.

Figure 28:
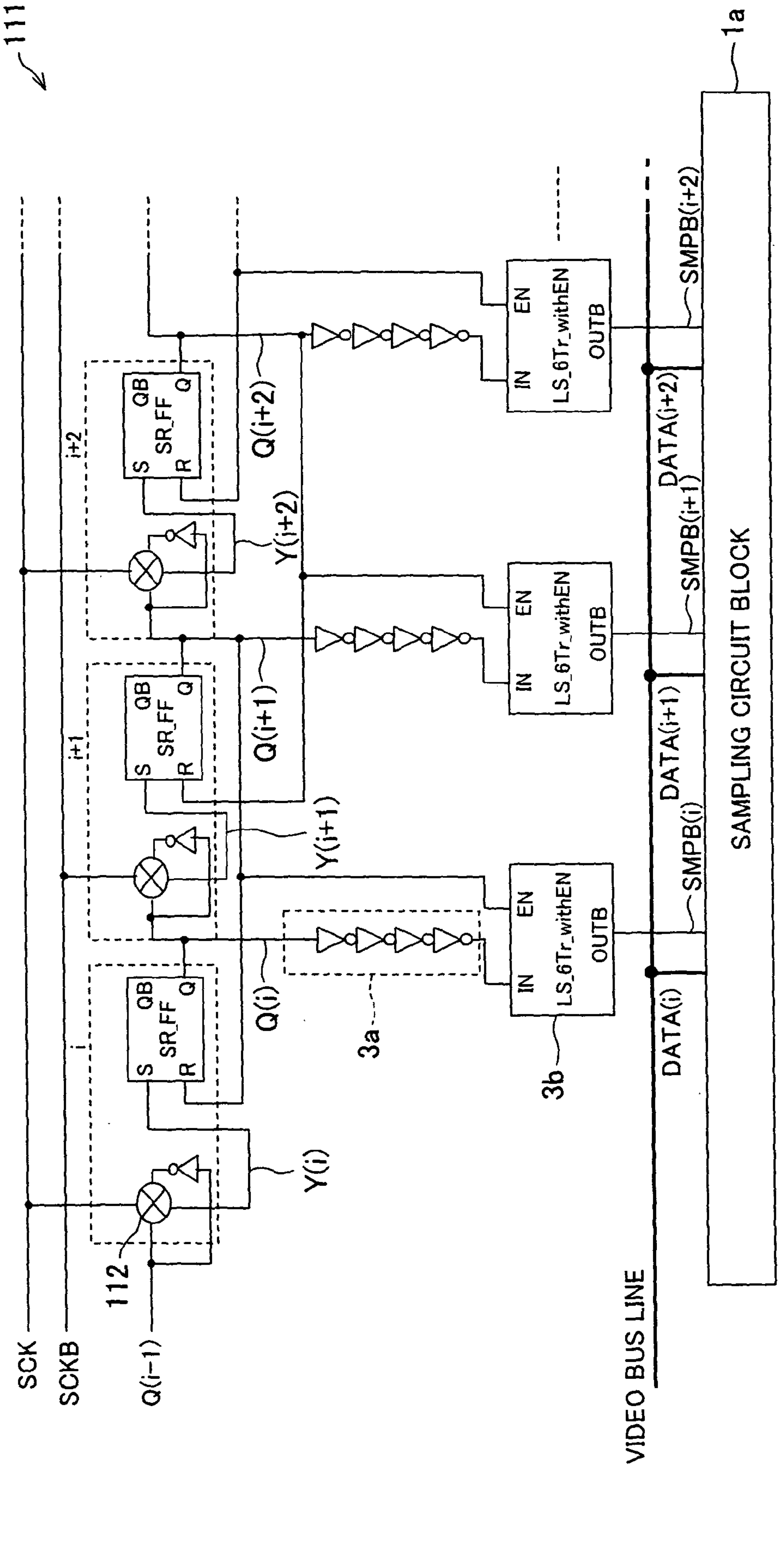
FIG. 28 is a circuit block diagram illustrating a structure of a source driver of FIG. 18 with notations for the explanation of Eighth Embodiment.
Figure 29:
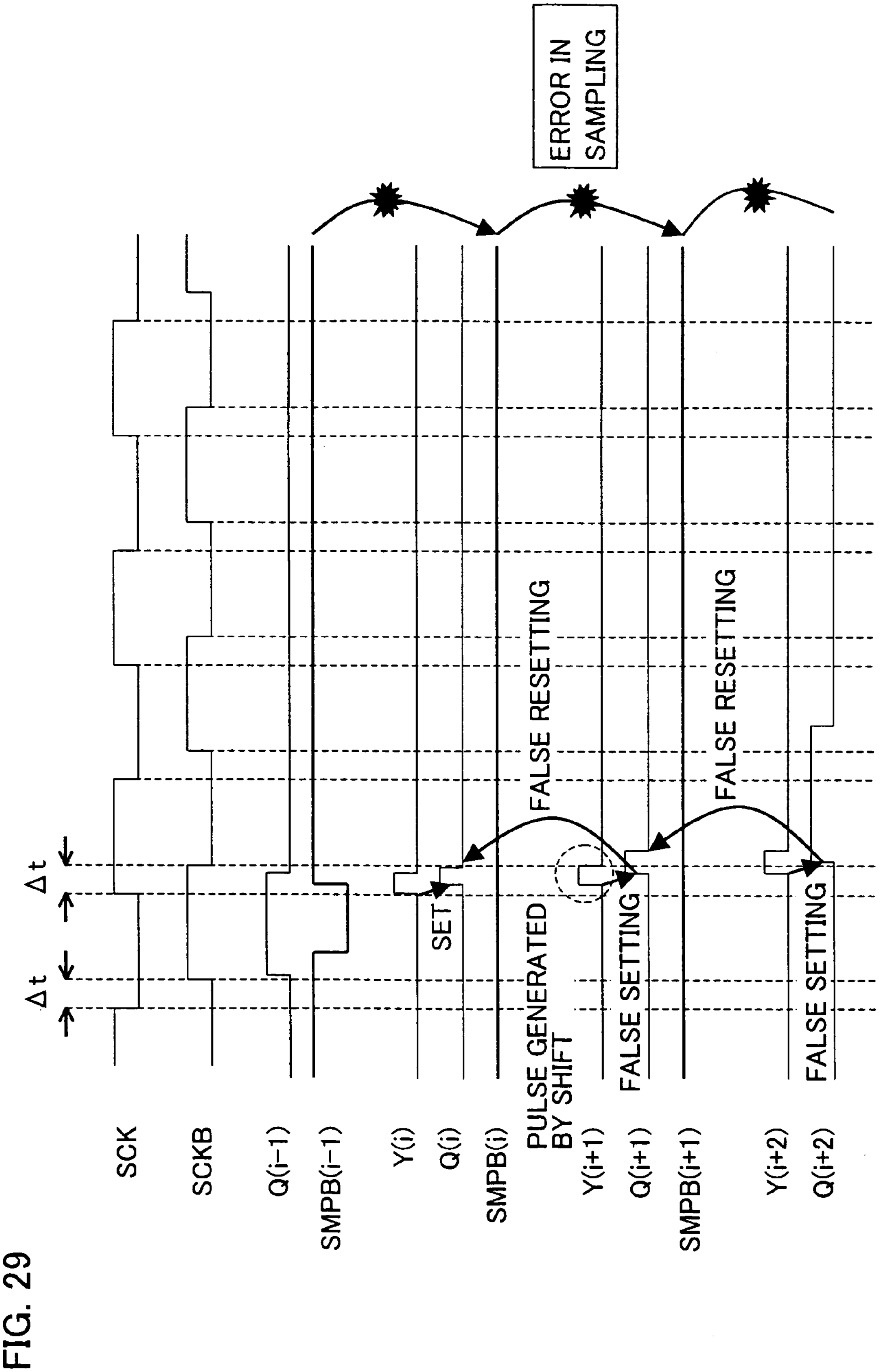
FIG. 29 is a timing chart showing operation of the source driver of FIG. 28 in which two clock signals are different in phase.

The invention of the present embodiment is to prevent malfunction of the circuit shown in FIG. 18, that is explained in Sixth Embodiment, when the external input clock signal SCK or SCKB is supplied with some phase shift. This malfunction due to improper scanning is specifically explained below with reference to FIGS. 28 and 29. FIG. 28 is the structure shown in FIG. 18 additionally having the names of the signals, and FIG. 29 shows waveforms of these signals. In FIG. 28, the output signal of the switch 112 is expressed as Y, and the output signal of the level shifter 3*b* is expressed as SMPB. Further, the number in the bracket after each notation indicates the number of the group.

In contract to the case of FIG. 19, the clock signal SCKB is shifted from the clock signal SCK by Δt as shown in FIG. 29, that is, they are not synchronized with each other. Further, in this case, the output signal Q (i−1) is supplied to the i-th group, except for the first stage to which a predetermined start pulse signal is externally supplied. When the output signal Q (i−1) is at a high level, the i-th analog switch 112 is conducted to let the clock signal SCK to pass through. Accordingly, the signal Y (i) rises at the rising point of the clock signal SCK.

Here, since the signal Y (i) is a set signal of the i-th group flip flop FF, the output signal Q (i) rises in response to the rise of the signal Y (i) with a slight delay. The operation is totally the same as usual so far.

After this, in response to the rise of the output signal Q (i), the i-th analog switch 112 is conducted to let the clock signal SCK to pass through. Here, if the delay of the clock signal SCKB from the clock signal SCK is greater than the delay of the output signal Q (i) from the signal Y (i), the clock signal SCKB is at a high level when the output signal Q (i) rises, and therefore, the signal Y (i+1) rises in response to the rise of the output signal Q (i). In the general operation in which the clock signal SCK and the clock signal SCKB are completely opposite in phase, the signal Y (i+1) should rise at the rising point of the clock signal SCKB that occurs half a clock period after the rise of the signal Y (i). Therefore, in the structure of FIG. 29, the output signal Q (i+1) rises half a clock period earlier, automatically resetting the output signal Q (i), so that the output signal Q (i) falls shortly after the rising. Further, due to the shifting of the clock signal SCKB from the clock signal SCK, the pulse of the signal Y (i+1) is generated in a wrong portion, and is supplied to the immediately later flip flop FF as a false set signal. Accordingly, the i+h-th groups (the groups later the i-th group) cannot obtain a proper scanning pulse (output signal Q), that further induce an improper output signal SMPB, thus causing malfunction of sampling.

Figure 26:
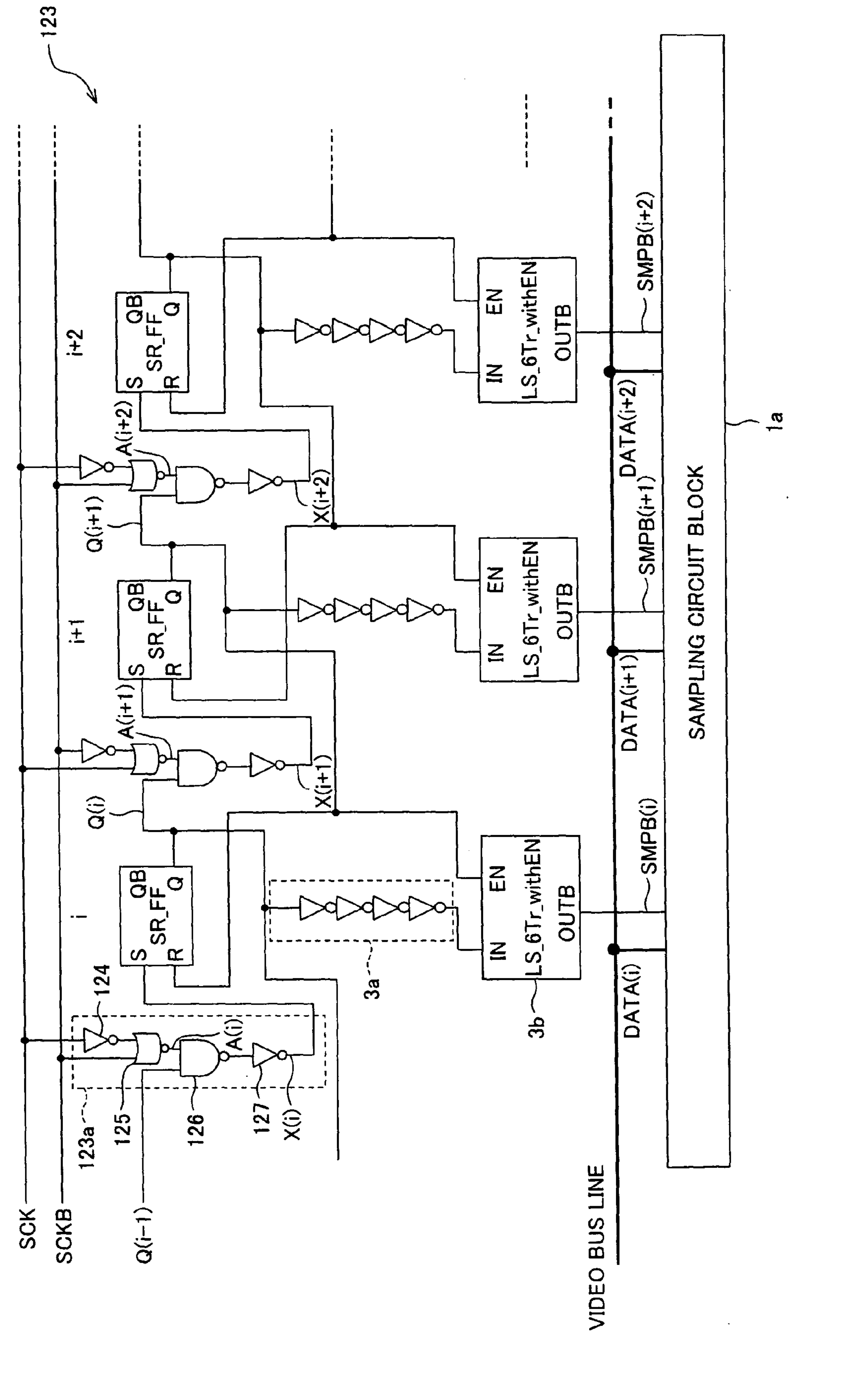
FIG. 26 is a circuit block diagram illustrating a structure of a source driver according to Eighth Embodiment of the present invention.
Figure 27:
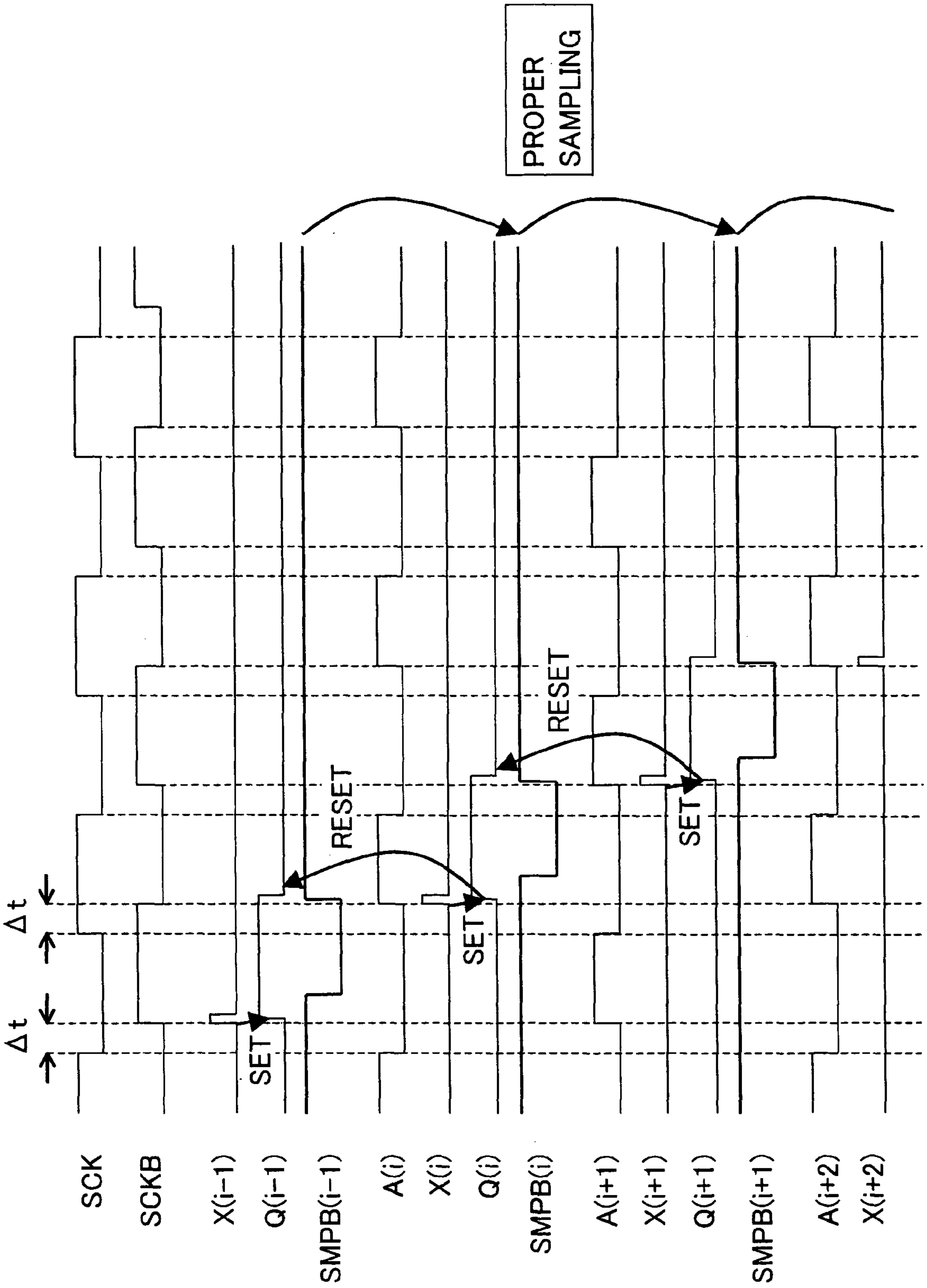
FIG. 27 is a timing chart showing operation of the source driver of FIG. 26.

Next, the following describes a structure to overcome the malfunction with reference to FIGS. 26 and 27. FIG. 26 shows a source driver 123 provided in a liquid crystal display device (the display device of the present embodiment), and the peripheral structure thereof. Apart from them, the liquid crystal display device further includes the display panel 1 and the gate driver 2 identical to those in First Embodiment.

The source driver 123 is identical to the source driver 111 of FIG. 18 except that the analog switch 112 is replaced with a malfunction prevention circuit 123*a*. The malfunction prevention circuit 123*a* includes an inverter 124, a two-input NOR 125, a two-input NAND circuit 126, and an inverter 127. The input terminal of the inverter 124 is connected to the line of the clock signal SCK in an even-numbered group, and is connected to the line of the clock signal SCKB in an odd-numbered group. One of the input terminals of the NOR circuit 125 is connected to the output terminal of the inverter 124, while the other is connected to the line of the clock signal SCKB in an even-numbered group, and is connected to the line of the clock signal SCK in an odd-numbered group. In FIG. 26, i is an even number. Note that, the respective connection relations of the even-numbered groups and the odd-numbered groups can be swapped.

The output terminal of the NOR circuit 125 is connected to one (first) of the input terminals of the NAND circuit 126. The other (second) input terminal of the NAND circuit 126 is connected to the output terminal Q of the flip flop FF of the immediately preceding stage. Note that, in the first stage, the start pulse signal is supplied to the second terminal of the NAND circuit 126. The output terminal of the NAND circuit 126 is connected to the input terminal of the inverter 127. The output terminal of the inverter 127 is connected to the set terminal S of the corresponding flip flop FF.

Hereinafter, the output signal of the NOR circuit 125 is expressed as A, the output signal of the inverter 127 is expressed as X, and the output signal of the level shifter 3*b* is expressed as SMPB. Further, the number in the bracket after each notation indicates the number of the group.

In contract to the case of FIG. 19, the clock signal SCKB is shifted from the clock signal SCK by Δt as shown in FIG. 27, that is, they are not synchronized with each other. The malfunction prevention circuit 123*a* is supplied with the clock signal SCK or the clock signal SCKB as an input signal, and processes the clock signal via the inverter 124 and the NOR circuit 125 to produces a signal A (i). As shown in FIG. 27, in the i-th group, the signal A (i) becomes high level only when the clock signal SCK is at a high level and the clock signal SCKB is at a low level, and becomes low level otherwise. Since the positions for supplying the clock signal SCK and the clock signal SCKB are exchanged in an even-numbered group and in an odd-numbered group, the clock signal SCKB is supplied to the inverter 124 in the i+1-th group, and the signal A (i+1) becomes high level only when the clock signal SCKB is at a high level and the clock signal SCK is at a low level, and becomes low level otherwise.

The produced signal A (i) and the output signal Q (i−1) are supplied to the NAND circuit 126, and processed through the NAND circuit and the inverter 127 to be a signal X (i). As shown in FIG. 27, the resulting signal X (i) becomes a pulse, that becomes high level only when both the output signal Q (i−1) and the signal A (i) are at a high level, and becomes low level otherwise.

The output signal Q (i) rises in response to the rise of the signal X (i) with a slight delay. Since the signal A (i+1) rises in substantially half a clock period after the output signal Q (i) becomes high level, the signal X (i+1) rises in substantially half a clock period after the output signal X (i) becomes high level. Therefore, the output signal Q (i+1) rises after the output signal Q (i) becomes high level, resetting the output signal Q (i). In this manner, each output signal Q is properly outputted, thereby properly outputting the signal SMPB. The foregoing example only deals with the case where the clock signal SCK and the clock signal SCKB are not synchronized; however, if they are synchronized, the foregoing structure still ensures proper operation.

In the present embodiment, the pulse of the output signal Q is produced from the periodic pulse signals different in phase, the clock signal. SCK and the clock signal SCKB, that are therefore not synchronized with each other. Further, the signal X, the pulse signal for determining the timing of the beginning end of the output signal Q is produced according to the timing specified by the signal SCKB chosen from the clock signals SCK and SCKB, using a combination of the signal A of the corresponding stage and the output signal Q of the immediately preceding stage. The beginning end of the output signal Q is determined according to the timing of producing the pulse of the signal X. Further, as shown in FIG. 27, a different timing of the clock signal is used for determining the beginning end of each output signal Q, i.e., to each group. In the present embodiment, the terminal end of the pulse of the output signal Q of the corresponding stage is automatically determined when the beginning end of the output signal Q of the next stage is determined. Therefore, the timing of the terminal end of each output signal Q is determined by a different timing of the same single clock signal SCKB.

In this manner, even with the timing clocks SCK and SCKB that are different in phase, i.e., not synchronized, the beginning ends of the respective output signals Q have different timings as they are determined by different timings of the clock signal SCKB. This prevents generation of pulse in a wrong portion due to the influence among the plural output signals Q, or generation of a pulse with inappropriately short period. On this account, the source driver 123 can be properly scanned, thus properly outputting the pulse of the output signal SMPB.

Note that, the foregoing structure normally uses plural clock signal, but only one of them is used for determining the beginning end of the pulse of the output signal Q. If the timing of the clock signal used for determining the timing is identical to those of other clock signals, it is regarded that the timing of the beginning end is determined not by plural clock signals but by a single clock signal.

The all embodiments have been described. Note that, the pulse has no waveform blunt in the foregoing embodiments; however, even in the presence of waveform blunt, the present invention may be realized with the same arrangement as above as long as there is a enough difference in timing of the respective pulses to cope with the foregoing delay time at the threshold that is recognizable as the pulse level. In this case, the point of the threshold value can be used as the beginning and terminal ends of the pulse. To more specifically describe this method with the structure of the foregoing embodiment, the first pulse is modified by removing not only the part from the terminal end to the beginning end of the reference pulse, but also the part after the terminal end.

Further, the TFT transistor used in the foregoing embodiments may be replaced with a common MOSFET or the like.

As described, the pulse output circuit (for example, the source driver 3, 51, 61, 91, 101, 111, 121 or 123) according to the present invention is a pulse output circuit that sequentially outputs pulses from plural output terminals, the pulse output circuit producing a first pulse as a source pulse of a pulse outputted from each of the plural output terminals, and then modifying the first pulse in waveform by inverting a pulse level from a predetermined point to a terminal end and setting a predetermined level and polarity, so as to produce a second pulse as the pulse outputted from said each of the plural output terminals.

As described, the pulse output circuit according to the present invention is arranged so that: a terminal end of the second pulse is determined according to a reference pulse whose beginning end is ahead of a terminal end of the first pulse by a predetermined period.

As described, the pulse output circuit according to the present invention is arranged so that: the reference pulse of the second pulse outputted from an i-th (i being a natural number) output terminal to output a second pulse is the first pulse of an i+k-th (k being a predetermined natural number) output terminal to output a second pulse. Note that, As described, the pulse output circuit according to the present invention is arranged so that: a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

As described, the pulse output circuit according to the present invention is arranged so that: the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

As described, the pulse output circuit according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

As described, the pulse output circuit according to the present invention is arranged so that: a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

As described, the pulse output circuit according to the present invention is arranged so that: the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

As described, the pulse output circuit according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse (the reference pulse of the second pulse outputted from the i-th output terminal to output a second pulse) by a smaller value than a delay of the second pulse, and (iii) the reference pulse of the second pulse outputted from the i+k-th output terminal to output a second pulse.

As described, the pulse output circuit according to the present invention is arranged so that: the first pulse is produced from plural periodic pulse signals, and a beginning end of the first pulse is determined according to a different timing of plural timings specified by one common periodic pulse signal of the plural periodic pulse signals.

As described, the driving circuit (for example, the source driver 3, 51, 61, 91, 101, 111, 121 or 123) according to the present invention is a driving circuit of a display device and includes the foregoing pulse output circuit, for outputting a second pulse as a sampling pulse of a video signal for the display device.

As described, the driving circuit according to the present invention is a driving circuit for a display device and includes a shift register for outputting the first pulse.

As described, the driving circuit according to the present invention is a driving circuit for a display device and includes the foregoing pulse output circuit is arranged so that: the shift register is constituted of set reset flip flops (for example, FF) provided for each of the output terminals, and a reset terminal of an i-th set reset flip flop is supplied with an output signal of an i+k-th set reset flip flop.

As described, the driving circuit according to the present invention is a driving circuit for a display device and includes the foregoing pulse output circuit that is arranged so that: the shift register is constituted of set reset flip flops (for example, FF) provided for each of the output terminals, a level shifter is provided at a preceding stage of each of the set reset flip flops for performing power-source-voltage exchange of an input signal of the flip flop, and a reset terminal of an i-th set reset flip flop is supplied with an output signal of the level shifter of an i+k-th set reset flip flop.

As described, the display device according to the present invention includes the foregoing driving circuit for a display device.

As described, the pulse output method according to the present invention comprises the steps of: (a) producing a first pulse as a source pulse of a pulse outputted from each of the plural output terminals; and (b) producing a second pulse with a waveform equal to a waveform obtained by inverting a pulse level of the first pulse from a predetermined point to a terminal end and setting a predetermined level and polarity.

As described, the pulse output method according to the present invention is arranged so that: a terminal end of the second pulse is determined according to a reference pulse whose beginning end is ahead of a terminal end of the first pulse by a predetermined period.

As described, the pulse output method according to the present invention is arranged so that: the reference pulse of the second pulse outputted from an i-th (i being a natural number) output terminal to output a second pulse is the first pulse of an i+k-th (k being a predetermined natural number) output terminal to output a second pulse.

As described, the pulse output method according to the present invention is arranged so that: a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

As described, the pulse output method according to the present invention is arranged so that: the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

As described, the pulse output method according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

As described, the pulse output method according to the present invention is arranged so that: a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

As described, the pulse output method according to the present invention is arranged so that: the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

As described, the pulse output method according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

As described, the pulse output method according to the present invention is arranged so that: the first pulse is produced from plural periodic pulse signals, and a beginning end of the first pulse is determined according to a different timing of plural timings specified by one common periodic pulse signal of the plural periodic pulse signals.

As described, the pulse output circuit (for example, the source driver 3, 51, 61, 91, 101, 111, 121 or 123) according to the present invention is a pulse output circuit that sequentially outputs pulses from plural output terminals, the pulse output circuit producing a first pulse as a source pulse of a pulse outputted from each of the plural output terminals, and then modifying the first pulse in waveform by inverting a pulse level from a predetermined point to a terminal end and setting a predetermined level and polarity, so as to produce a second pulse as the pulse outputted from said each of the plural output terminals.

With this arrangement, each of the pulses sequentially outputted from the plural output terminals is the second pulse that is terminated before the terminal end of the first pulse, thereby reducing the delay of the terminal end of each pulse.

As described, the pulse output circuit according to the present invention is arranged so that: a terminal end of the second pulse is determined according to a reference pulse whose beginning end is ahead of a terminal end of the first pulse by a predetermined period.

With this arrangement, the inversion of the pulse level for a predetermined period of the first pulse can be easily performed with reference to the beginning end of the reference pulse.

As described, the pulse output circuit according to the present invention is arranged so that: the reference pulse of the second pulse outputted from an i-th (i being a natural number) output terminal to output a second pulse is the first pulse of an i+k-th (k being a predetermined natural number) output terminal to output a second pulse.

With this arrangement, since the first pulse can be used as the reference pulse, generation of another signal can be omitted.

As described, the pulse output circuit according to the present invention is arranged so that: a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

With this arrangement, the i-th second pulse and the i+k-th second pulse are not overlapped with each other.

As described, the pulse output circuit according to the present invention is arranged so that: the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

With this arrangement, by using the delayed reference pulse and supplying the inversion level not related to the delay of the reference pulse, it is possible to easily produce the second pulses not overlapped with each other.

As described, the pulse output circuit according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

With this arrangement, it is possible to easily produce the second pulses not overlapped with each other by using pulse logic calculations, for example, based on OR, or AND logic; otherwise, using a logic element such as an analog switch.

As described, the pulse output circuit according to the present invention is arranged so that: a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

With this arrangement, the i-th second pulse and the i+k-th second pulse are not overlapped with each other.

As described, the pulse output circuit according to the present invention is arranged so that: the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

With this arrangement, by using the delayed reference pulse of the second pulse of the preceding stage and the reference pulse of the corresponding stage, and supplying the inversion level not related to the delay of the reference pulse of the second pulse of the preceding stage, it is possible to easily produce the second pulses not overlapped with each other.

As described, the pulse output circuit according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

With this arrangement, it is possible to easily produce the second pulses not overlapped with each other by using pulse logic calculations, for example, based on OR, or AND logic; otherwise, using a logic element such as an analog switch.

As described, the pulse output circuit according to the present invention is arranged so that: the first pulse is produced from plural periodic pulse signals, and a beginning end of the first pulse is determined according to a different timing of plural timings specified by one common periodic pulse signal of the plural periodic pulse signals.

With this arrangement, even with the periodic pulse signals that are different in phase, i.e., not synchronized, the respective first pulses have different beginning ends according to the timings of one of the periodic pulses signal. This prevents generation of pulse in a wrong portion due to the influence among the plural first pulses, or generation of a pulse with inappropriately short period.

As described, the driving circuit according to the present invention is a driving circuit of a display device and includes the foregoing pulse output circuit, for outputting a second pulse as a sampling pulse of a video signal for the display device.

With this arrangement, in the structure in which the sampling pulses are sequentially outputted from plural output terminals, the delay of the terminal end of each sampling pulse can be reduced, thereby properly sampling video signals.

As described, the driving circuit according to the present invention is a driving circuit for a display device and includes a shift register for outputting the first pulse.

With this arrangement, proper sampling of video signals is ensured in the driving circuit using a shift register.

As described, the driving circuit according to the present invention is a driving circuit for a display device and includes the foregoing pulse output circuit is arranged so that: the shift register is constituted of set reset flip flops (for example, FF) provided for each of the output terminals, and a reset terminal of an i-th set reset flip flop is supplied with an output signal of an i+k-th set reset flip flop.

In this arrangement, the first pulse is outputted from a set reset flip flop, and the sampling pulse is produced with the output pulse of the i-th set reset flip flop that is terminated after the beginning end of the output pulse of the i+k-th set reset flip flop.

As described, the driving circuit according to the present invention is a driving circuit for a display device and includes the foregoing pulse output circuit that is arranged so that: the shift register is constituted of set reset flip flops (for example, FF) provided for each of the output terminals, a level shifter is provided at a preceding stage of each of the set reset flip flops for performing power-source-voltage exchange of an input signal of the flip flop, and a reset terminal of an i-th set reset flip flop is supplied with an output signal of the level shifter of an i+k-th set reset flip flop.

In this arrangement, the first pulse is outputted from a set reset flip flop, and the sampling pulse is produced with the output pulse of the i-th set reset flip flop that is terminated after the beginning end of the output pulse of the i+k-th level shifter.

As described, the display device according to the present invention includes the foregoing driving circuit for a display device.

With this arrangement, a superior display can be performed due to appropriate sampling of video signals.

As described, the pulse output method according to the present invention comprises the steps of: (a) producing a first pulse as a source pulse of a pulse outputted from each of the plural output terminals; and (b) producing a second pulse with a waveform equal to a waveform obtained by inverting a pulse level of the first pulse from a predetermined point to a terminal end and setting a predetermined level and polarity.

With this arrangement, each of the pulses sequentially outputted from the plural output terminals is the second pulse that is terminated before the terminal end of the first pulse, thereby reducing the delay of the terminal end of each pulse.

As described, the pulse output method according to the present invention is arranged so that: a terminal end of the second pulse is determined according to a reference pulse whose beginning end is ahead of a terminal end of the first pulse by a predetermined period.

With this arrangement, the inversion of the pulse level for a predetermined period of the first pulse can be easily performed with reference to the beginning end of the reference pulse.

As described, the pulse output method according to the present invention is arranged so that: the reference pulse of the second pulse outputted from an i-th (i being a natural number) output terminal to output a second pulse is the first pulse of an i+k-th (k being a predetermined natural number) output terminal to output a second pulse.

With this arrangement, since the first pulse can be used as the reference pulse, generation of another signal can be omitted.

As described, the pulse output method according to the present invention is arranged so that: a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

With this arrangement, the i-th second pulse and the i+k-th second pulse are not overlapped with each other.

As described, the pulse output method according to the present invention is arranged so that: the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

With this arrangement, by using the delayed reference pulse and supplying the inversion level not related to the delay of the reference pulse, it is possible to easily produce the second pulses not overlapped with each other.

As described, the pulse output method according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

With this arrangement, it is possible to easily produce the second pulses not overlapped with each other by using pulse logic calculations, for example, based on OR, or AND logic; otherwise, using a logic element such as an analog switch.

As described, the pulse output method according to the present invention is arranged so that: a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

With this arrangement, the i-th second pulse and the i+k-th second pulse are not overlapped with each other.

As described, the pulse output method according to the present invention is arranged so that: the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

With this arrangement, by using the delayed second pulse and the reference pulse, and supplying the inversion level not related to the delay of the reference pulse, it is possible to easily produce the second pulses not overlapped with each other.

As described, the pulse output method according to the present invention is arranged so that: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

With this arrangement, it is possible to easily produce the second pulses not overlapped with each other by using pulse logic calculations, for example, based on OR, or AND logic; otherwise, using a logic element such as an analog switch.

As described, the pulse output method according to the present invention is arranged so that: the first pulse is produced from plural periodic pulse signals, and a beginning end of the first pulse is determined according to a different timing of plural timings specified by one common periodic pulse signal of the plural periodic pulse signals.

With this arrangement, even with the periodic pulse signals that are different in phase, i.e., not synchronized, the respective first pulses have different beginning ends according to the timings of one of the periodic pulses signal. This prevents generation of pulse in a wrong portion due to the influence among the plural first pulses, or generation of a pulse with inappropriately short period.

As described, the present invention can be suitably used for a general display device that sequentially writes data to the data lines.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A shift register that sequentially outputs pulses from plural output terminals of the shift register, wherein each stage of the shift register includes a set-reset flip flop corresponding to each of the plural output terminals, said each stage of the shift register produces, as a source pulse of a pulse output from said each of the plural output terminals, a first pulse which includes a pulse output from said set-rest flip flop and which has a terminal end determined by a reset pulse input to said set-reset flip flops, said each stage of the shift register outputs the first pulse from an output terminal of said set-reset flip flop, said each stage of the shift register produces a second pulse, the second pulse having a waveform equal to a waveform obtained by inverting a pulse level of the first pulse from a desired point to a terminal end and setting a desired level and polarity, the inversion is carried out by performing, on the first pulse, calculations including a logic calculation using a reference pulse that occurs earlier than the terminal end of the first pulse by a desired period of time, the setting of the desired level and polarity of the second pulse is carried out by performing power-source-voltage exchange using a level shifter the shift register outputs the second pulse from said each plural output terminals corresponding to said each stage of the shift register, and a terminal end of the second pulse occurs earlier in time than the terminal end of a corresponding first pulse.

2. The shift register as set forth in claim 1, wherein:

the terminal end of the second pulse is determined according to the reference pulse whose beginning end occurs earlier than a terminal end of the first pulse by a desired period of time.

3. The shift register as set forth in claim 2, wherein:

the reference pulse of the second pulse outputted from an i-th (i being a natural number) output terminal to output a second pulse is the first pulse of an i+k-th (k being a predetermined natural number) output terminal to output the second pulse.

4. The pulse output circuit as set forth in claim 2, wherein:

a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

5. The pulse output circuit as set forth in claim 4, wherein:

the second pulse outputted from the i+k-th output terminal to output a second pulse is produced through modification of the first pulse in waveform, that is performed by (i) delaying the reference pulse of the second pulse outputted from the i-th output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

6. The pulse output circuit as set forth in claim 4, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

7. The pulse output circuit as set forth in claim 3, wherein: a beginning end of the second pulse outputted from the i+k-th (i being a natural number, k being a predetermined natural number) output terminal to output a second pulse is determined by delaying a beginning end of the reference pulse of the second pulse outputted from the i-th output terminal to output a second pulse.

8. The pulse output circuit as set forth in claim 7, wherein: the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

9. The pulse output circuit as set forth in claim 7, wherein: the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

10. The pulse output circuit as set forth in claim 2, wherein: a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

11. The pulse output circuit as set forth in claim 10, wherein:

the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

12. The pulse output circuit as set forth in claim 10, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

13. The pulse output circuit as set forth in claim 3, wherein: a beginning end of the second pulse outputted from the i+k-th (i being a natural number, k being a predetermined natural number) output terminal to output a second pulse is determined by delaying a terminal end of the reference pulse of the second pulse outputted from the i-th output terminal to output a second pulse.

14. The pulse output circuit as set forth in claim 13, wherein:

the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

15. The pulse output circuit as set forth in claim 13, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

16. The shift register as set forth in claim 1, wherein: the first pulse is produced from plural periodic pulse signals, and a beginning end of each first pulse is determined according to a different timing of plural timings specified by one common periodic pulse signal of the plural periodic pulse signals.

17. A driving circuit of a display device including a shift register, for outputting a second pulse as a sampling pulse of a video signal for the display device, wherein:

each stage of the shift register includes a set-reset flip flop corresponding to each plural output terminals of the shift register, said each stage of the shift register sequentially outputs pulses from said plural output terminals, and produces, as a source pulse of a pulse output from said each of the plural output terminals, a first pulse which includes a pulse output from said set-rest flip flop and which has a terminal end determined by a reset pulse input to said set-reset flip flops, said each stage of the shift register outputs the first pulse from an output terminal of said set-reset flip flop, said each stage of the shift register produces a second pulse, the second pulse having a waveform equal to a waveform obtained by inverting a pulse level of the first pulse from a predetermined point to a terminal end and setting a predetermined level and polarity, the inversion is carried out by performing, on the first pulse, calculations including a logic calculation using a reference pulse that occurs earlier than the terminal end of the first pulse by a desired period of time, the setting of the desired level and polarity of the second pulse is carried out by performing power-source-voltage exchange using a level shifter the shift register outputs the second pulse from said each plural output terminals corresponding to said each stage of the shift register, and a terminal end of the second pulse occurs earlier in time than the terminal end of a corresponding first pulse.

18. The driving circuit of a display device as set forth in claim 17, wherein:

the shift register is arranged so that: the terminal end of the second pulse is determined according to a reference pulse whose beginning end precedes a terminal end of the first pulse by a predetermined period, and the reference pulse of the second pulse outputted from the i-th (i being a natural number) output terminal to output the second pulse is the first pulse of the i+k-th (k being a predetermined natural number) output terminal to output the second pulse, and the shift register is constituted of set reset flip flops provided for each of the output terminals, and a reset terminal of an i-th set reset flip flop is supplied with an output signal of an i+k-th set reset flip flop.

19. The driving circuit of a display device as set forth in claim 17, wherein:

the shift register is arranged so that: the terminal end of the second pulse is determined according to a reference pulse, a beginning end of the reference pulse preceding a terminal end of the first pulse by a predetermined period, the reference pulse of the second pulse outputted from the i-th (i being a natural number) output terminal to output the second pulse is the first pulse of the i+k-th (k being a predetermined natural number) output terminal to output the second pulse, and the shift register is constituted of set reset flip flops provided for each of the output terminals, a level shifter is provided at a preceding stage of each of the set reset flip flops for performing power-source-voltage exchange of an input signal of the flip flop, and a reset terminal of an i-th set reset flip flop is supplied with an output signal of the level shifter of an i+k-th set reset flip flop.

20. A display device including a driving circuit for a display device, wherein the driving circuit of a display device includes a shift register for outputting a second pulse as a sampling pulse of a video signal for the display device, the shift register includes a plurality of stages and corresponding plural output terminals, each stage of the shift register including a set-rest flip flop corresponding to each of the plural of output terminals and sequentially outputting pulses from the plural output terminals, each stage of the shift register produces, as a source pulse of a pulse output from said each of the plural output terminals, a first pulse which includes a pulse output from said set-rest flip flop and which has a terminal end determined by a reset pulse input to said set-reset flip flops, said each stage of the shift register outputs the first pulse from an output terminal of said set-reset flip flop, said each stage of the shift register produces a second pulse, the second pulse having a waveform equal to a waveform obtained by inverting a pulse level of the first pulse from a predetermined point to a terminal end and setting a predetermined level and polarity, the inversion is carried out by performing, on the first pulse, calculations including a logic calculation using a reference pulse that occurs earlier than the terminal end of the first pulse by a desired period of time, the setting of the desired level and polarity of the second pulse is carried out by performing power-source-voltage exchange using a level shifter the shift register outputs the second pulse from said each plural output terminals corresponding to said each stage of the shift register, and a terminal end of the second pulse occurs earlier in time than the terminal end of a corresponding first pulse.

21. A pulse output method for sequentially outputting pulses from plural output terminals of a shift register, the method comprising the steps of:

(a) producing, in each stage of the shift register including a set-reset flip flop corresponding to each of the plural output terminals, a first pulse as a source pulse of a pulse output from said each of the plural output terminals, the first pulse including a pulse output from said set-reset flip flop and having a terminal end determined by a reset pulse input to said set-rest flip flop; and (b) producing a second pulse, the second pulse having a waveform equal to a waveform obtained by inverting a pulse level of the first pulse from a predetermined point to a terminal end and setting a predetermined level and polarity, the inversion being carried by performing, on the first pulse, calculations including a logic calculation using a reference pulse that occurs earlier than the terminal end of the first pulse by a predetermined period of time, the setting of the desired level and polarity of the second pulse is carried out by performing power-source-voltage exchange using a level shifter, and the shift register outputs the second pulse from said each plural output terminals corresponding to said each stage of the shift register, wherein a terminal end of the second pulse occurs earlier in time than the terminal end of a corresponding first pulse.

22. The pulse output method as set forth in claim 21, wherein:

the terminal end of the second pulse is determined according to the reference pulse whose beginning end occurs earlier than a terminal end of the first pulse by the predetermined period of time.

23. The pulse output method as set forth in claim 22, wherein:

the reference pulse of the second pulse outputted from an i-th (i being a natural number) output terminal to output the second pulse is the first pulse of an i+k-th (k being a predetermined natural number) output terminal to output the second pulse.

24. The pulse output method as set forth in claim 22, wherein:

a beginning end of the second pulse outputted from an i+k-th (i being a natural number, k being a predetermined natural number) output terminal to output a second pulse is determined by delaying a beginning end of the reference pulse of the second pulse outputted from an i-th output terminal to output a second pulse.

25. The pulse output method as set forth in claim 24, wherein:

the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

26. The pulse output method as set forth in claim 24, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

27. The pulse output method as set forth in claim 23, wherein:

a beginning end of the second pulse outputted from the i+k-th (i being a natural number, k being a predetermined natural number) output terminal to output a second pulse is determined by delaying a beginning end of the reference pulse of the second pulse outputted from the i-th output terminal to output a second pulse.

28. The pulse output method as set forth in claim 27, wherein:

the second pulse outputted from the i+k-th output terminal to output a second pulse is produced through modification of the first pulse in waveform, that is performed by (i) delaying the reference pulse of the second pulse outputted from the i-th (i being a natural number) output terminal to output a second pulse, (ii) using the reference pulse thus delayed until a beginning end of the reference pulse of the second pulse outputted from the i+k-th output terminal to output a second pulse, and (iii) supplying after the beginning end an inversion level of the reference pulse thus delayed.

29. The pulse output method as set forth in claim 27, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i+k-th output terminal.

30. The pulse output method as set forth in claim 22, wherein:

a beginning end of the second pulse outputted from an i+k-th (i being a natural number, k being a predetermined natural number) output terminal to output a second pulse is determined by delaying a terminal end of the reference pulse of the second pulse outputted from an i-th output terminal to output a second pulse.

31. The pulse output method as set forth in claim 30, wherein:

the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

32. The pulse output method as set forth in claim 30, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

33. The pulse output method as set forth in claim 23, wherein:

a beginning end of the second pulse outputted from the i+k-th (i being a natural number, k being a predetermined natural number) output terminal to output a second pulse is determined by delaying a terminal end of the reference pulse of the second pulse outputted from the i-th output terminal to output a second pulse.

34. The pulse output method as set forth in claim 33, wherein:

the second pulse outputted from the i+k-th output terminal to output a second pulse is produced through modification of the first pulse in waveform, that is performed by (i) delaying the second pulse outputted from the i-th output terminal to output a second pulse, (ii) using the reference pulse of the second pulse outputted from the i-th output terminal to output a second pulse from a terminal end of the second pulse thus delayed to a beginning end of the reference pulse of the second pulse outputted from the i+k-th output terminal to output a second pulse, and (iii) supplying after the beginning end an inversion level of the reference pulse of the second pulse outputted from the i-th output terminal to output a second pulse.

35. The pulse output method as set forth in claim 33, wherein:

the second pulse outputted from the i+k-th output terminal to output a second pulse is produced by modifying the first pulse in waveform with a logic calculation using (i) a pulse obtained by delaying the reference pulse of the second pulse outputted from the i-th output terminal to output a second pulse, and (ii) the reference pulse of the second pulse outputted from the i-th output terminal to output a second pulse or a pulse obtained by delaying said reference pulse by a smaller value than a delay of the second pulse, and (iii) the reference pulse of the second pulse outputted from the i+k-th output terminal to output a second pulse.

36. The pulse output method as set forth in claim 21, wherein:

the first pulse is produced from plural periodic pulse signals, and a beginning end of the first pulse is determined according to a different timing of plural timings specified by one common periodic pulse signal of the plural periodic pulse signals.

* * * * *